(12) United States Patent
Yu et al.

(10) Patent No.: US 12,245,506 B2
(45) Date of Patent: Mar. 4, 2025

(54) HYDRO-ELECTROCHEMICAL POWER GENERATORS AND ASSOCIATED METHODS

(71) Applicant: The Texas A&M University System, College Station, TX (US)

(72) Inventors: Choongho Yu, College Station, TX (US); Yufan Zhang, College Station, TX (US)

(73) Assignee: The Texas A&M University System, College Station, TX (US)

( * ) Notice: Subject to any disclaimer, the term of this patent is extended or adjusted under 35 U.S.C. 154(b) by 452 days.

(21) Appl. No.: 17/550,874

(22) Filed: Dec. 14, 2021

(65) Prior Publication Data

US 2022/0190226 A1 Jun. 16, 2022

Related U.S. Application Data

(60) Provisional application No. 63/125,261, filed on Dec. 14, 2020.

(51) Int. Cl.
*H10N 10/13* (2023.01)
*H01M 6/36* (2006.01)
*H10N 10/856* (2023.01)

(52) U.S. Cl.
CPC .............. *H10N 10/13* (2023.02); *H01M 6/36* (2013.01); *H10N 10/856* (2023.02)

(58) Field of Classification Search
CPC ........ H01M 6/36; H01M 14/00; H01N 10/13; H01N 10/856; H10N 10/13; H10N 10/856
USPC .......................................................... 429/112
See application file for complete search history.

(56) References Cited

U.S. PATENT DOCUMENTS

| 2008/0131765 A1* | 6/2008 | Imanaga ............... H01M 50/51 |
| | | 219/127 |
| 2021/0020362 A1* | 1/2021 | Chang .................... H01G 9/028 |
| 2021/0143446 A1* | 5/2021 | Ponec ................. H01M 10/613 |

FOREIGN PATENT DOCUMENTS

| WO | WO-2015164907 A1 * | 11/2015 | ............ H01M 14/00 |
| WO | WO-2017143273 A1 * | 8/2017 | ............. H01G 11/02 |

OTHER PUBLICATIONS

Yang et al., In Situ Fabricated PEDOT:PSS:PANI with Enhanced Thermoelectric Performance by Organic Solvent and CSA Treatment, Sep. 2, 2020, Synthetic Metals, 269, pp. 1 and 5 (Year: 2020).*

(Continued)

*Primary Examiner* — James M Erwin
*Assistant Examiner* — John S Medley
(74) *Attorney, Agent, or Firm* — Conley Rose, P.C.

(57) ABSTRACT

A hydro-electrochemical power generator includes an interlayer having a first end and a second end opposite the first end, a first electrode in contact with the first end of the interlayer, wherein the first electrode includes a first material that is a corrodible metallic material, a second electrode in contact with the second end of the interlayer, wherein the second electrode includes a second material that is a corrodible metallic material, and at least one heat source coupled to one of the first electrode and the second electrode and configured to apply a temperature gradient across the first end and the second end of the interlayer, and wherein the first electrode and the second electrode are configured to output a non-zero electrical voltage in response to the application of the temperature gradient.

9 Claims, 18 Drawing Sheets

(56) References Cited

OTHER PUBLICATIONS

Li et al., β-FeOOH Interlayer With Abundant Oxygen Vacancy Toward Boosting Catalytic Effect for Lithium Sulfur Batteries, Apr. 23, 2020, Frontiers in Chemistry, p. 1 (Year: 2020).*
Guobin Xue et al.: Water-evaporation-induced electricity with nanostructured carbon materials; Nature Nanotechnology; Jan. 30, 2017, DOI: 10.10.38/NNANO.2016.300.
Fei Zhao et al.: Direct Power Generation from a Graphene Oxide Film under Moisture; Advanced Materials, DOI: 10.1002/adma.201501867; Adv. Mater. 2015, 27, 4351-4357.
Zhuhua Zhang et al.: Emerging hydrovoltaic technology; Nature Nanotechnology, vol. 13, Dec. 2018; https://doi.org/10.1038/s41565-018-0228-6; 1109-1119.
Tong Xu et al.: An efficient polymer moist-electric generator; Energy & Environmental Science; Feb. 20, 2019, DOI: 10.1039/c9ee00252a; 972-978.
Xiaomeng Liu et al.: Power generation from ambient humidity using protein nanowires; Nature, vol. 578, Feb. 27, 2020; https://doi.org/10.1038/s41586-020-2010-9.
Yuan Liang et al.: Electric power generation via asymmetric moisturizing of graphene oxide for flexible, printable and portable electronics; Energy & Environmental Science, Apr. 24, 2018; DOI: 10.1039/c8ee00671g.

\* cited by examiner

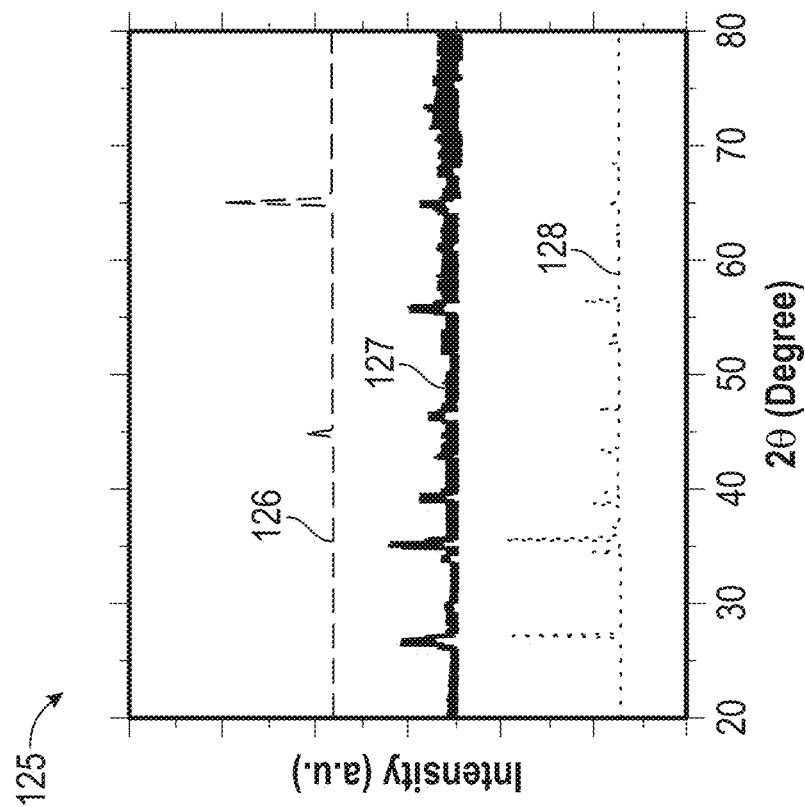
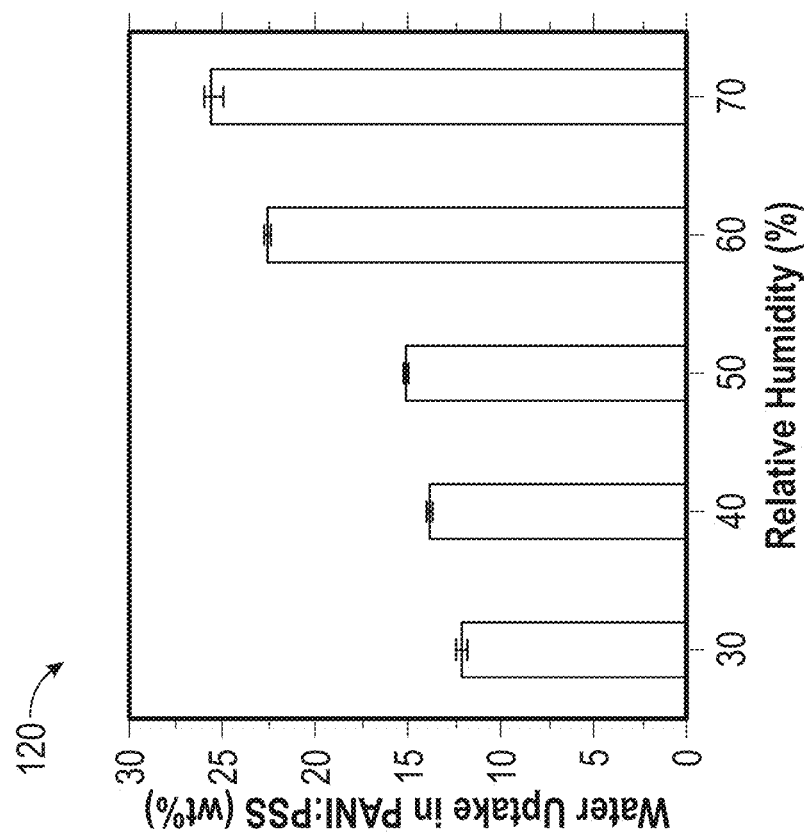

HYDRO-ELECTROCHEMICAL POWER GENERATORS AND ASSOCIATED METHODS

CROSS-REFERENCE TO RELATED APPLICATIONS

This application claims benefit of U.S. provisional patent application Ser. No. 63/125,261 filed Dec. 14, 2020, and entitled "Systems and Methods for Generating Thermopower," which is hereby incorporated herein by reference in its entirety for all purposes.

STATEMENT REGARDING FEDERALLY SPONSORED RESEARCH OR DEVELOPMENT

This invention was made with government support under CBET 1805963 awarded by the U.S. National Science Foundation. The government has certain rights in the invention.

BACKGROUND

Compact electronic devices including, for example, wearable devices and Internet of things (IoT) devices continue to proliferate. Such compact electronic devices depend on power delivered sustainably by compact, light-weight, and inexpensive power generators. In some instances, power generators for compact electronic devices may scavenge energy from the environment and/or from waste energy such as solar energy, thermal energy, electrochemical energy, and/or mechanical energy. Some power generators may rely on water-enabled energy conversion to produce electrical power. Water, given its abundance, low-cost, and environmentally benign nature, provides an attractive source for energy in powering compact electronic devices.

BRIEF SUMMARY OF THE DISCLOSURE

An embodiment of a hydro-electrochemical power generator comprises an interlayer having a first end and a second end opposite the first end, a first electrode in contact with the first end of the interlayer, wherein the first electrode comprises a first material that is a corrodible metallic material, a second electrode in contact with the second end of the interlayer, wherein the second electrode comprises a second material that is a corrodible metallic material, and at least one heat source coupled to one of the first electrode and the second electrode and configured to apply a temperature gradient across the first end and the second end of the interlayer, and wherein the first electrode and the second electrode are configured to output a non-zero electrical voltage in response to the application of the temperature gradient. In some embodiments, the first material and the second material are the same material. In some embodiments, the first material and the second material are the same carbon steel material. In certain embodiments, the interlayer comprises a solid-state electrolyte comprising a water bearing hygroscopic material. In certain embodiments, the hygroscopic material comprises polyaniline and polystyrene sulfonate (PANI:PSS). In some embodiments, an interfacial surface of at least one of the first and second electrodes in contact with the electrolyte comprises an oxidation layer containing $\beta$-FeOOH.

An embodiment of a hydro-electrochemical power generator comprises a solid-state electrolyte having a first end and a second end opposite the first end, wherein the electrolyte comprises a water bearing hygroscopic material, a first electrode in contact with the first end of the electrolyte, a second electrode in contact with the second end of the electrolyte, and at least one heat source coupled to one of the first electrode and the second electrode and configured to apply a temperature gradient across the first end and the second end of the electrolyte, and wherein the first electrode and the second electrode are configured to output a non-zero electrical voltage in response to the application of the temperature gradient. In some embodiments, the hygroscopic material comprises polyaniline and polystyrene sulfonate (PANI:PSS). In some embodiments, an interfacial surface of at least one of the first and second electrodes in contact with the electrolyte comprises an oxidation layer containing $\beta$-FeOOH. In certain embodiments, the first electrode comprises a first material, the second electrode comprises a second material, and the first material is the same as the second material. In certain embodiments, the first electrode comprises a first material, the second electrode comprises a second material, and the first material and the second material are each a corrodible metallic material. In some embodiments, the electrolyte has a water content greater than 10% by weight (wt %).

An embodiment of a hydro-electrochemical power generator comprises a solid-state electrolyte having a first end and a second end opposite the first end, wherein the electrolyte comprises a water bearing hygroscopic material, a first electrode in contact with the first end of the electrolyte, wherein the first electrode comprises a first material that is a corrodible, carbon including metallic material, and a second electrode in contact with the second end of the electrolyte, wherein the second electrode comprises the first material, wherein the first electrode and the second electrode are configured to output a non-zero electrical voltage in response to providing at least one of the first electrode and the second electrode with water. In some embodiments, the second electrode has the same configuration as the first electrode. In some embodiments, the first material is carbon steel. In certain embodiments, the first electrode and the second electrode are each porous and water permeable. In certain embodiments, the first electrode and the second electrode each comprise a metallic wool layer sandwiched between a pair of metallic mesh layers. In some embodiments, the electrolyte comprises a solid-state acid embedded with graphite particles aligned with each other and each extending perpendicular to an axis extending longitudinally through the first and second ends of the electrolyte. In some embodiments, the acid comprises polystyrene sulfonic acid (PSS—H) and the graphite particles each comprise chemically expanded graphite (CEG). In certain embodiments, the hydro-electrochemical power generator comprises a water reservoir coupled to the second electrode and configured to supply the second electrode with water, and wherein the first electrode comprises a top electrode positioned vertically above the second electrode which comprises a bottom electrode.

BRIEF DESCRIPTION OF THE DRAWINGS

For a detailed description of exemplary embodiments of the disclosure, reference will now be made to the accompanying drawings in which:

FIG. 7 is a graph illustrating water uptake as a function of relative humidity;

FIG. 8 is a graph illustrating X-ray diffraction patterns for several different materials;

DETAILED DESCRIPTION

Figure 2:
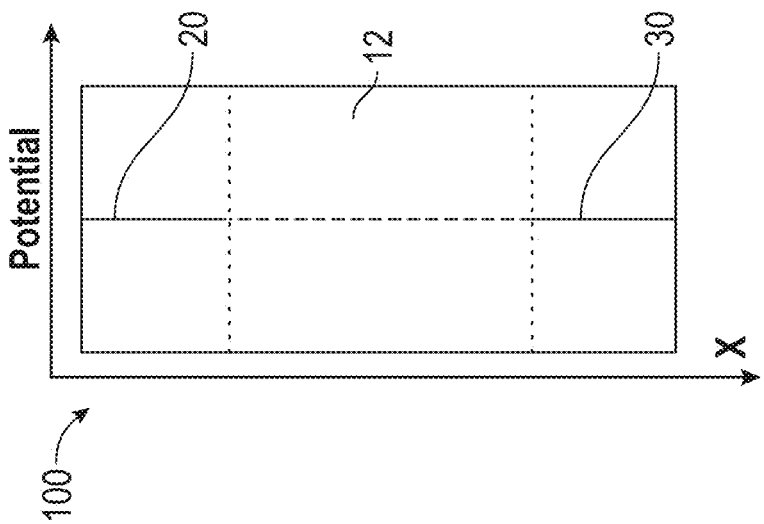
FIG. 2 is a graph illustrating the overpotential of a pair of electrodes of the power generator of FIG. 1 in the first state.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection, or through an indirect connection via other devices, components, and connections. In addition, as used herein, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis. As used herein, the terms "approximately," "about," "substantially," and the like mean within 10% (i.e., plus or minus 10%) of the recited value. Thus, for example, a recited angle of "about 80 degrees" refers to an angle ranging from 72 degrees to 88 degrees.

As described above, the proliferation of compact electronic devices including, for example, wearable devices and IoT devices, demand the sustainable delivery of electrical power via compact, light-weight, and inexpensive power generators. Water may be utilized as an energy source for electrically powering such compact electronic devices. For example, water-enabled energy conversion may be utilized as a source of electrical power where ions are transported through an ion conductor (e.g., serving as an electrolyte) to generate electrical voltage between a pair of electrodes. The ion transport is governed by the diffusion of water molecules, which can be triggered by temperature difference or concentration differences within the water.

Various methods of generating electrical power from water include triboelectrification, streaming current, ion-gradient induced electric power generation, and the development of interfacial structures. Water may be utilized to generate voltages (~1 Volt (V) as an example) adequate to operate compact electronic devices and substantially greater than the voltages produced by conventional thermoelectric power generators. Nevertheless, the duration of the water-enabled current generation may be undesirably short in conventional power generators, making the actual electrical energy insufficiently low to operate electronics for desired time periods.

In one embodiment of the current disclosure, water is utilized to produce electrical power thermoelectrically with a sufficient voltage over a sufficiently long duration to adequately power compact electronic devices including wearable devices and IoT devices. The term "thermoelectricity" generally refers to converting heat to electricity or vice versa, and has been used for various applications, including thermocouples and Peltier devices. It is typically desired to generate a large voltage per temperature difference (i.e., large thermopower or Seebeck coefficient in the unit of Volt Kelvin$^{-1}$(V K$^{-1}$), resulting from the thermodiffusion of electrons often referred to as the Seebeck effect. However, conventional thermoelectric devices relying on solid-state inorganic and organic thermoelectric materials typically produce small thermopower values on the order of 0.01-0.1 millivolts mV K$^{-1}$ (mV K$^{-1}$) at or near room temperature.

To induce a thermally induced voltage on the order of 1-10 mV K$^{-1}$, a few different mechanisms have been attempted, including the thermodiffusion of electron/ion mixture (both Soret and Seebeck effects) and temperature-dependent redox reactions with redox couples in liquid states. Solid-state polyelectrolytes utilizing the Soret effect may produce the greatest thermopower of conventional thermoelectric devices, but the highest thermopower values attainable from such devices can typically only be obtained at unusually high (70-100%) relative humidity (RH) rather than typical room humidity (~50% RH). Water is an electrolyte for the ions, improving their mobility, and water makes mobile ions readily dissociated from their counter ions. However, high water uptake in solid state polyelectrolytes often causes stability problems due to irreversible water evaporation and swelling. Considering that a high thermal-to-electrical conversion (TtoE) factor is important to performance, it is valuable to seek other routes for attaining even larger TtoE factors. It should be noted that the term "TtoE factor," rather than thermopower and Seebeck coefficient, is used herein to simultaneously account for various principles generating thermally induced voltage. For example, to acquire a working voltage (>1 V) for typical wearable electronics with traditional inorganic materials, at least 1000 thermoelectric legs should be serially connected under a temperature difference of 10° C.

Embodiments disclosed herein include thermoelectric power generators that rely on the thermodiffusion of water to generate sufficiently high and sustainable electrical voltages for powering compact electronic devices. In some embodiments, carbon steel is utilized as the material for electrodes to obtain a colossal TtoE factor of −87 mV K−1 under a typical ambient condition (50% RH, 22° C.). Porous hydrophilic layers may be formed on the carbon steel electrodes, and a hygroscopic solid-state polyelectrolyte layer may be provided between the two electrodes. Upon imposing a temperature difference, the thermodiffusion of water from the hotter side to the colder side alters the water uptake in the electrode, differentiating the potential of the two electrodes. Based on this transport mechanism, self-powered compact electronic devices can be developed. For example, an embodiment of a self-sustainable fever-detection device is described herein, which could be helpful in the early and fast detection of fever commonly observed from a viral infection such as COVID, SARS, MERS, or swine flu.

Referring initially to FIGS. 1-6, an embodiment of a hydro-electrochemical power generator 10 is shown. In this exemplary embodiment, power generator 10 comprises a thermoelectric device that, upon the imposition of a temperature difference, produces an electrical voltage through the thermodiffusion of water from a relatively warmer or hotter side of the power generator 10 to a relatively cooler or colder side of the power generator 10. In this exemplary embodiment, power generator 10 generally includes an interlayer or solid-state electrolyte 12, a pair of spaced corrodible electrodes 20, 30, a pair of spaced heating devices or heat sources 40, 50, a pair of electrical connectors or terminals 60, 62, and a pair of temperature sensors or probes 70, 72.

The electrolyte 12 of power generator 10 is disposed between electrodes 20, 30 and comprises a hygroscopic material such as, for example, a hygroscopic solid-state polyelectrolyte, which contains the water (indicated schematically by arrow 14 in FIG. 1) that is thermodiffused during the operation of power generator 10. In this exemplary embodiment, electrolyte 12 comprises a polyaniline and polystyrene sulfonate (PANI:PSS) material; however, in other embodiments, electrolyte 12 may comprise other solid-state hygroscopic materials such as, for example cellulose, metal-organic framework (MOF), sodium polyacrylate, and/or various salt hydrates (e.g., Zn(NO3)2-6H2O).

In some embodiments, electrolyte 12 may be formed by synthesizing PANI:PSS powders with polystyrene sulfonic acid (PSS—H) and aniline, and then dissolved in deionized water with hydrochloric acid. The solution may be drop-casted on two carbon steel electrodes, and two pieces assembled before they were fully dried. After the assembly, the sample may be left in a fume hood at a controlled RH. During this time period, the surface of the carbon steel is corroded, forming either a fully or intermediately developed oxidation layer between the PANI:PSS electrolyte and the electrodes of the power generator depending on the RH and residency time. The PANI:PSS electrolyte and electrodes may be encapsulated (e.g., using a polymer such as silicone) to seal off the electrolyte and electrodes from the surrounding environment.

Being formed from a hygroscopic material, the amount of water molecules 14 contained within electrolyte 12 or "water uptake" is dependent on the RH in the environment surrounding the electrolyte 12 during its formation. For example, referring briefly to FIG. 7, a graph 120 is shown illustrating water uptake for different PANI:PSS solid-state electrolytes formed in environments having different RHs. In this example, the PANI:PSS solid-state electrolytes were exposed to their respective RHs for a period of approximately eight hours as each PANI:PSS solid-state electrolyte was formed. Graph 120 illustrates that even at moderate RH (e.g., RH of 50% or less) a PANI:PSS solid-state electrolyte may have a substantial water uptake or content of over 10% by weight (wt %).

Referring again to FIGS. 1-6, in this exemplary embodiment, electrodes 20, 30 of power generator 10 comprise a carbon steel material; however, in other embodiments, electrodes 20, 30 may comprise other metals and metallic materials which are subject to corrosion such as, for example all metals excluding noble metals (e.g., gold platinum, etc.) which are not subject to corrosion. In this exemplary embodiment, each electrode 20, 30 comprises the same corrodible material; however, it may be understood that in other embodiments the material comprising the first or top electrode 20 may differ from the material comprising the second or bottom electrode. Additionally, in this exemplary embodiment, electrodes 20, 30 comprise substantially planar-shaped foils that are positioned directly adjacent opposing ends 13, 15 of the electrolyte 12. Particularly, each electrode 20, 30 has a contact or interfacial surface 22, 32, respectively, that contacts the corresponding end 13, 15 of the electrolyte 12. In some embodiments, the interfacial surfaces 22, 32 of electrodes 20, 30 comprise an oxidation layer that may either be intermediately or fully developed during the formation of the electrolyte 12 and electrodes 20, 30.

In this configuration, the water molecules 14 contained within electrolyte 12 are permitted to contact and corrode the interfacial surfaces 22, 32 of the electrodes 20, 30. For example, referring briefly to FIG. 8, a graph 125 is shown illustrating exemplary X-ray diffraction (XRD) patterns for pristine carbon steel 126, a corroded electrode 127 (e.g., one of electrodes 20, 30 in a corroded condition), and $\beta$-FeOOH 128. The XRD patterns illustrated in graph 125 indicate that a porous oxidation layer is formed between the interfacial surface of the electrode 127 and the solid-state electrolyte (e.g., electrolyte 12) contacted by the interfacial surface of the electrode 127. The porous layer may comprise nanorods comprising $\beta$-FeOOH.

Referring again to FIGS. 1-6, as will be discussed further herein, the rate of corrosion of electrodes 20, 30 may be controlled by controlling a temperature gradient extending between the ends 13, 15 of electrolyte 12. Additionally, each electrode 20, 30 has a thickness extending between the interfacial surface 22, 32, respectively, and an outer surface 24, 34 of electrode 20, 30 opposing the corresponding interfacial surface 22, 32. The thickness of electrodes 20, 30 may determine an operational lifespan of the power generator 10.

The heat sources 40, 50 of power generator 10 controllably and selectably apply a temperature gradient across the electrolyte 12 between the ends 13, 15 thereof. Particularly, each heat source 40, 50 is configured to selectably provide heat into one of the ends 13, 15 of the electrolyte 12. Heat sources 40, 55 may be connected to a control unit or controller 55 (shown schematically in FIG. 1) of power generator 10 that is configured to control the operation of heat sources 40, 50. Additionally, the other heat source 40, 50 (not providing heat) may cool the opposing end 13, 15 of the electrolyte 12. Thus, in at least some embodiments, in addition to heating, heat sources 40, 50 may also selectably cool the ends 13, 15 of the electrolyte 12. For example, controller 55 may establish, via heat sources 40, 50, a desired temperature difference or gradient between the first end 13 and the second end 15 of the electrolyte 12. The controller 55 can operate heat sources 40, 50 such that the first end 13 of electrolyte 12 is made hotter than the second end 15 and vice-versa. The magnitude of the temperature gradient established between the ends 13, 15 of electrolyte 12 can control an electrical power output of the power generator 10. Temperature sensors 70, 72 of power generator 10 monitor the temperature gradient across the electrolyte 12 established by the controller 55 and heat sources 40, 50, and provide feedback to the controller 55. It may be understood that in some embodiments power generator 10 may not include temperature sensors 70, 72. Additionally, in some embodiments, power generator 10 may only include a single heat source 40 or 50.

In this exemplary embodiment, each heat source 40, 50 comprises a thermoelectric heat pump such as a solid-state Peltier device configured to both heat and cool the corresponding ends 13, 15 of the electrolyte 12 in response to supplying the Peltier device with electrical power. It may be understood that in other embodiments the configuration of heat sources 40, 50 may vary, and heat sources 40, 50 may comprise a variety of different devices used to provide heating and/or cooling.

The electrical terminals 60, 62 of power generator 10 are electrically coupled to the electrodes 20, 30, respectively, and the electrical voltage produced by power generator 10 during operation is produced across electrical terminals 60, 62. A compact electronic device such as a wearable device, IoT device, or other device, can be powered by the power generator 10 by connecting the compact electronic device to the electrical terminals 60, 62 of power generator 10.

Figure 1:
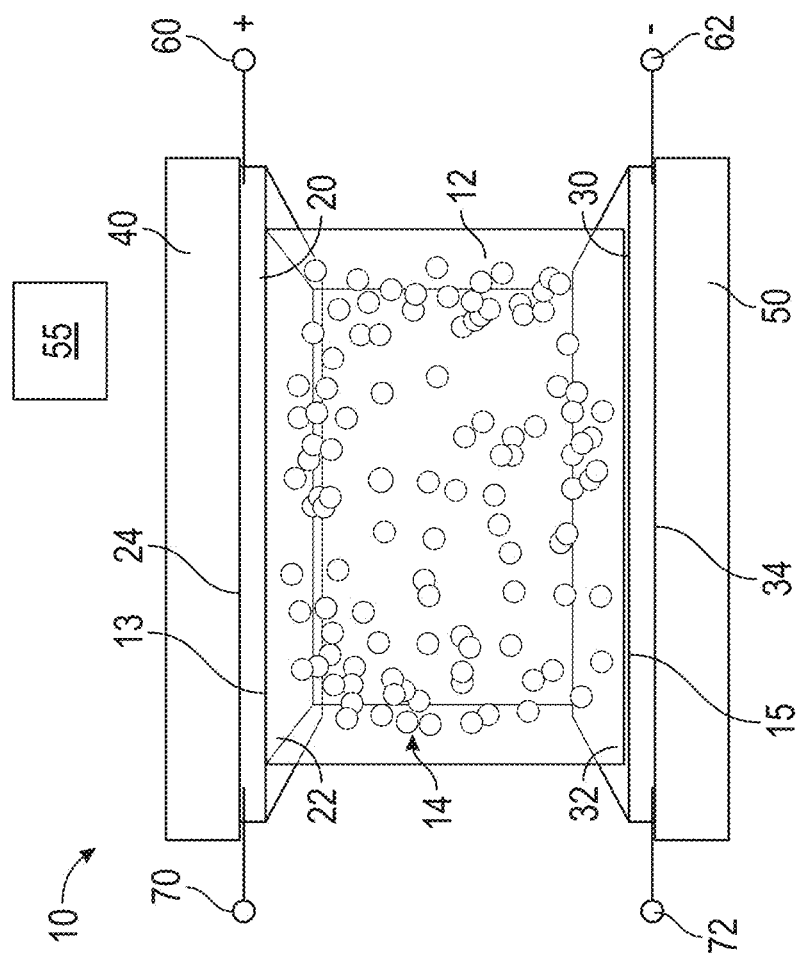
FIG. 1 is a schematic side view of an embodiment of a hydro-electrochemical power generator in a first state and in accordance with principles described herein.
Figure 4:
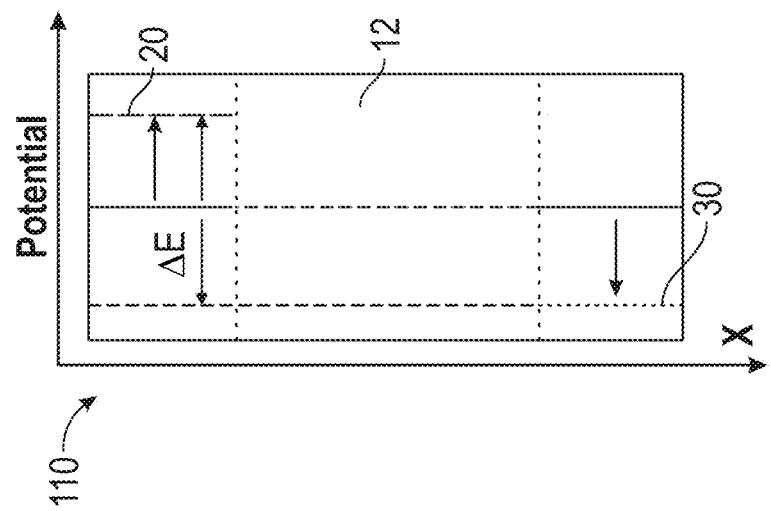
FIG. 4 is a graph illustrating the overpotential of the pair of electrodes of the power generator of FIG. 1 in the second state.
Figure 3:
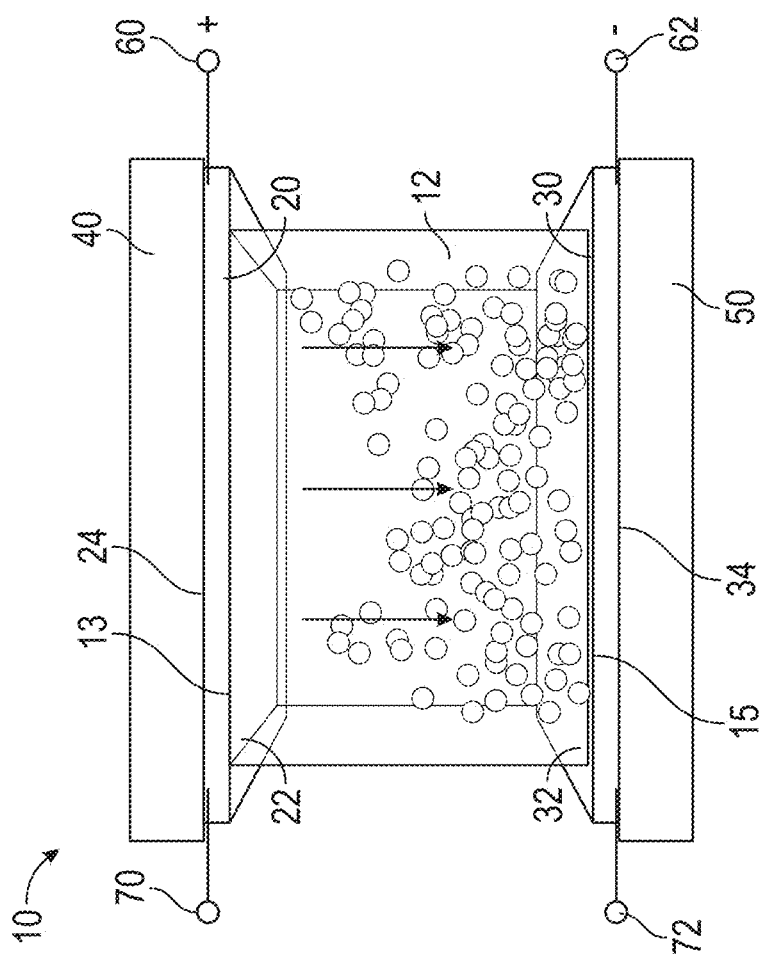
FIG. 3 is a schematic side view of the power generator of FIG. 1 in a second state.

As shown particularly in FIGS. 1, 2, power generator 10 is shown in an OFF state. Under a uniform temperature with a temperature gradient of effectively zero between the heat sources 40, 50, water molecules 14 are distributed uniformly within electrolyte 12 and the electrical potentials of electrical terminals 60, 62 are substantially identical. Particularly, FIG. 2 illustrates a graph 100 depicting the electrical potentials of the electrodes 20, 30 when the heat sources 40, 50 are not being operated to produce a temperature gradient across electrolyte 12. FIGS. 3, 4, show power generation 10 in an ON state. Particularly, when the temperature of the top electrode 20 is increased relative to the temperature of the bottom electrode 30 by the action of heat sources 40, 50, the water molecules 14 within electrolyte 12 diffuse through electrolyte 12 and towards the colder, bottom electrode 30.

As the amount of water molecules 14 that have migrated towards the bottom electrode 30 increases with time, the electrical potential in the hotter, top electrode 20 is increased while the electrical potential in the cooler, bottom electrode 30 is lowered as shown particularly in the graph 115 of FIG. 4. The decrease in electrical potential in the bottom electrode 30 correlates with an increase in a rate of corrosion of the bottom electrode 30 in response to the diffusion of water molecules 14 towards the bottom electrode 30, while the increase in electrical potential of the top electrode 30 correlates with a decrease in a rate of corrosion of the top electrode 20 in response to the diffusion of water molecules 14 away from the top electrode 20.

Figure 6:
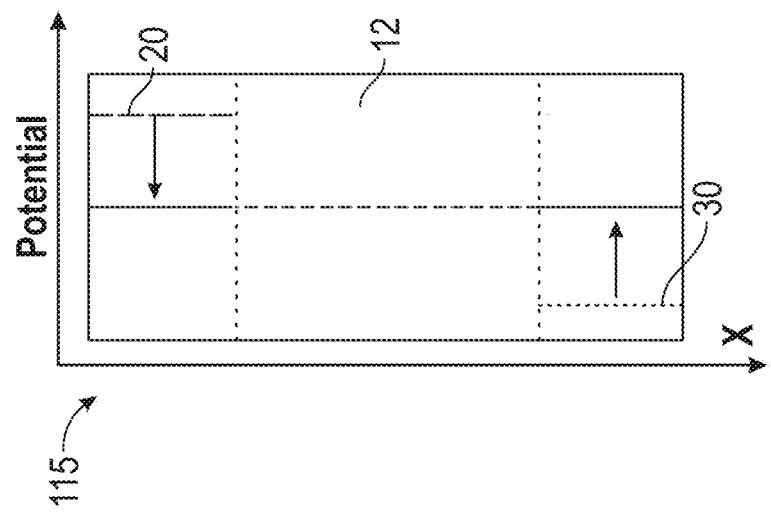
FIG. 6 is a graph illustrating the overpotential of the pair of electrodes of the power generator of FIG. 1 in the third state.
Figure 5:
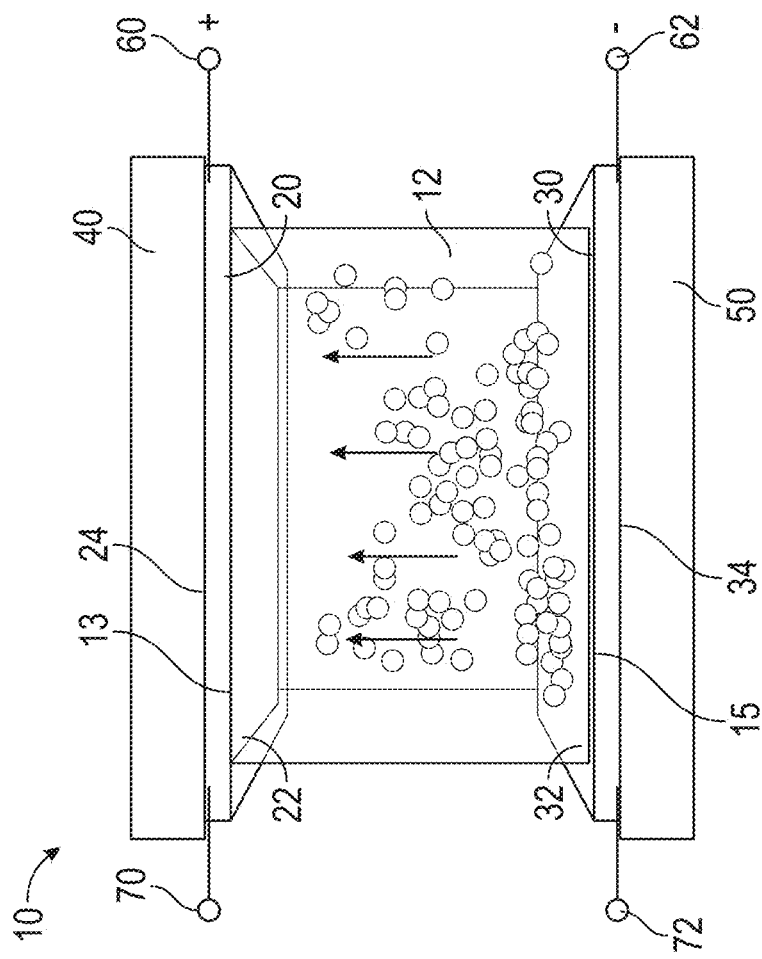
FIG. 5 is a schematic side view of the power generator of FIG. 1 in a third state.

As shown particularly in FIGS. 5, 6, once the operation of heat sources 40, 50 has been discontinued and the temperature gradient across electrolyte 12 has been permitted to substantially reach zero, the water molecules 14 within electrolyte 12 return to their initial, uniformly distributed states. As shown particularly in the graph 115 of FIG. 6, the electrical potentials of electrodes 20, 30 also return to their initial equilibrium concurrent with the migration of the water molecules 14 towards their initial uniformly distributed state. Additionally, the elevated rate of corrosion of the bottom electrode 30 reduces to its initial state in equilibrium with the top electrode 20.

In at least some embodiments, the working principle of the diffusion of water molecules 14 through electrolyte 12 maximizes the TtoE factor of power generator 10 at approximately 50% RH rather than monotonically increasing trends with a higher RH as with conventional devices. When the water uptake in the electrolyte 12 is too high, it is hard to induce a significant difference in the water concentrations on the two electrodes, resulting in a lower voltage. Conversely, low water uptake is unfavorable to the thermodiffusion of water due to the limited amount of water.

With the temperature gradient across electrolyte 12 returned to zero, the power generator 10 is returned to its OFF state. The power generator 10 may be returned to its ON state to resume generating electrical power by activating heat sources 40, 50 to apply a temperature gradient between the ends 13, 15 of electrolyte 12. When the operation of heat sources 40, 50 is resumed, top electrode 20 may be cooled while bottom electrode 30 may be heated to accelerate the corrosion rate of top electrode 20 while impeding the corrosion rate of bottom electrode 30, thereby more evenly corroding electrodes 20, 30 and maximizing the operational life of the power generator 10.

Figure 9:
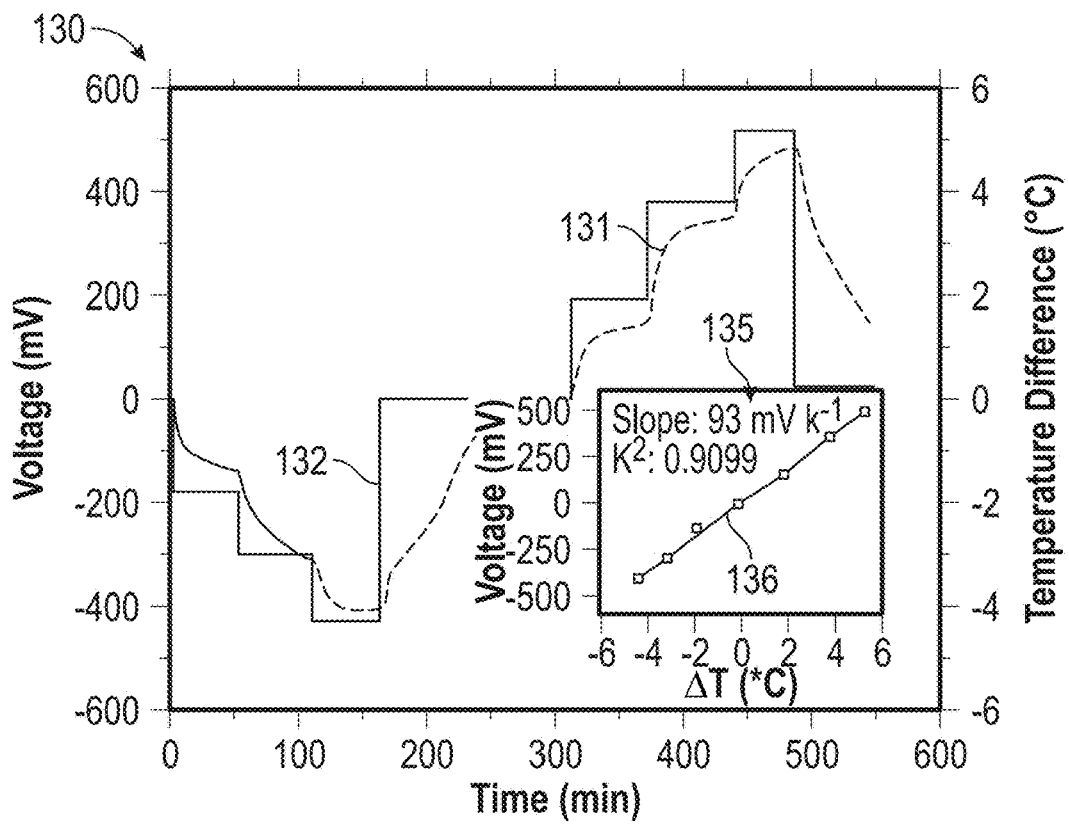
FIG. 9 is a graph illustrating a voltage profile of an embodiment of a power generator in accordance with principles described herein.

Referring briefly to FIG. 9, a graph 130 is shown illustrating an exemplary voltage profile 131 (e.g., measured from the electrical terminals of the power generator) produced by a power generator similar in configuration to power generator 10 in response to the formation of a temperature gradient 132 across the solid-state electrolyte (e.g., electrolyte 12) of the power generator 10. In this example, the voltage profile 131 is produced from a power generator with a fully developed oxidation layer in the electrodes thereof (e.g., electrodes 20, 30) under 50% RH as a function of time when the temperature gradient is altered. An inset graph 135 of FIG. 9 indicates a saturated voltage 136 at the corresponding temperature seeks a slope of approximately 93 mV K$^{-1}$. It should be noted that the sign of the number for the slope should be reversed to get the TtoE factor (i.e., a positive slope means a negative TtoE factor) like conventional thermopower.

In an in experiment, it was found that the magnitude of the TtoE factor increased as the oxidation time of the carbon steel was elongated in the ambient condition, but it did not further increase after approximately 60 days. Consistent values within the range of 85 mV K$^{-1}$ to 87 mV K$^{-1}$ were also observed after approximately 120 days and 180 days. In an experiment, the TtoE factor for a hydro-electrochemical power generator similar in configuration to device 10 and having a fully developed oxidation layer was approximately −48 mV K$^{-1}$ with the electrolyte of the device formed at 30% RH, and at approximately −87 mV K$^{-1}$ when the electrolyte was formed at 50% RH. In a second case in which the oxidation layer of the power generator was only intermediately developed the TtoE factor for the device was approximately −47 mV K$^{-1}$ at 50% RH.

The difference in the TtoE factor for the fully developed and intermediately developed cases mainly was due to the impedance change of the oxidation layer. A greater potential difference between electrodes can be developed when the impedance of the oxidation layer was enlarged. For example, according to electrochemical impedance spectroscopy experimentation, the impedance of a PANI:PSS electrolyte on the order of 10Ω was significantly raised to values on the order of kΩ with the oxidation layer, and larger impedance was observed from the fully developed case. Experiments also indicated an optimum RH close to 50% RH for maximizing the TtoE factor of the exemplary hydro-electrochemical power generator unlike conventional thermoelectric devices which typically show monotonically increasing TtoE factors with RH. In fact, the optimum performance at 50% RH is ideal because it is close to that of typical indoor environments. The difference in the relationship between the TtoE factor and RH between the hydro-electrochemical power generators described herein and conventional power generators may be due to a difference in the working principle as, unlike the hydro-electrochemical power generators described herein, conventional devices rely instead on the thermodiffusion of ions (e.g., protons) rather than changes in the rates of corrosion of the electrodes.

Figure 10:
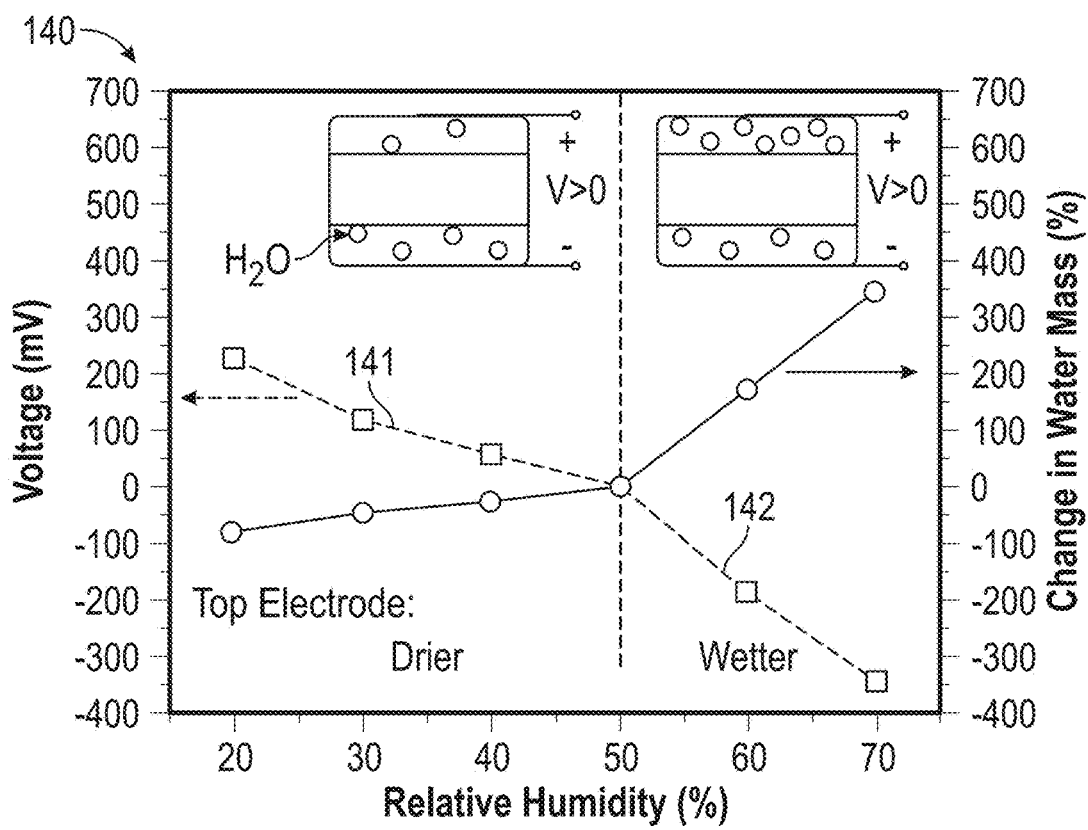
FIG. 10 is a graph illustrating voltage and change in water mass as a function of relative humidity (i.e., in drier and wetter conditions)

As voltage generation generally depends on humidity, experiments were conducted illustrating the influence of water uptake on voltage generation. Specifically, one of the electrodes of an experimental hydro-electrochemical power generator was taken out of the experimental power generator and exposed to environmental conditions whose RH was altered from 50% RH to 20% RH and 70% RH for approximately twelve hours. Referring briefly to FIG. 10, the porous layer on the electrode can accommodate water from the humid environment or release water initially present in the 50% RH condition, as indicated in graph 140 of FIG. 10 which illustrates voltage 141 and change in water mass 142 in drier and wetter conditions. In this experiment, when the electrode was reassembled, the voltage was altered substantially, showing higher (or lower) potential with less (or more) water. When water moves from the hotter side to the colder side, the hotter side has a higher potential than the colder side, which agrees with the trend (slope) shown in the inset graph 135 of FIG. 9.

Figure 11:
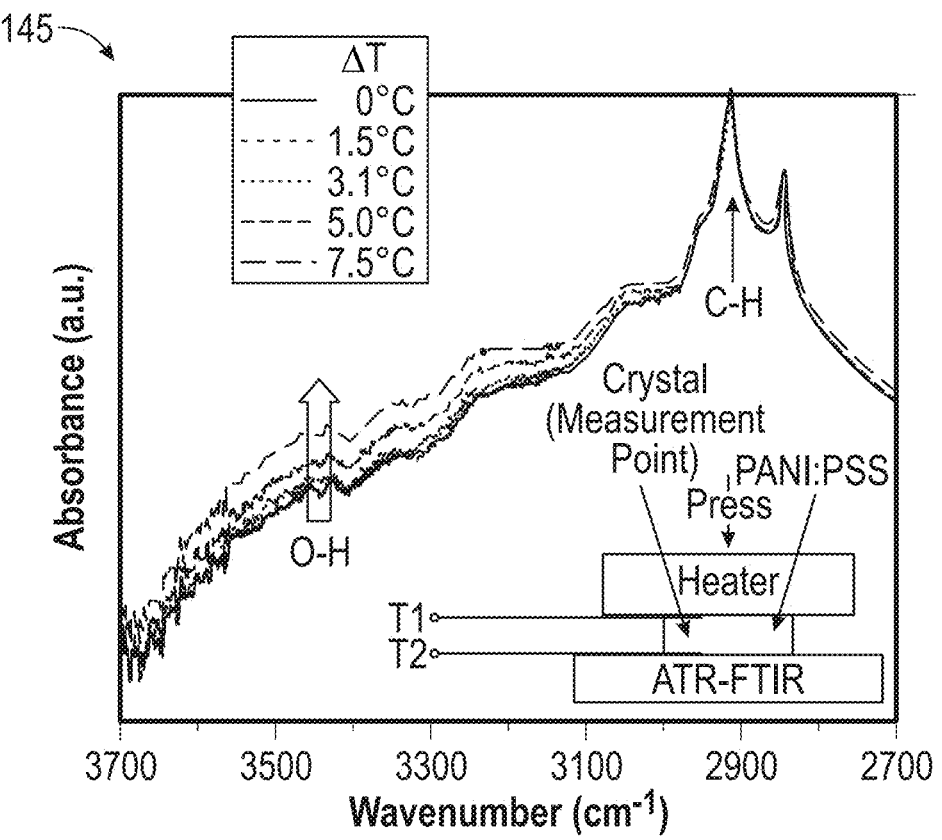
FIG. 11 is a graph illustrating absorbance as a function of wavenumber at several different temperatures.

Referring to FIG. 11, as illustrated in graph 145 of FIG. 11, in another experiment in situ attenuated total reflectance (ATR) Fourier transform-infrared spectroscopy (FTIR) was used to identify the thermodiffusion of water in PANI:PSS by comparing the intensity of O—H stretching band for water, which appears over a broad range near 2800-3700 centimeters$^{-1}$ (cm$^{-1}$) with its peak at approximately 3450 cm$^{-1}$ while one side of PANI:PSS was heated to several different temperatures. In this experiment, all the spectra were normalized by the peak intensity at 2914 cm$^{-1}$ corresponding to C—H stretching of the CH2 group in PSS. The absorbance peak near 3450 cm$^{-1}$ from the colder side was intensified as the temperature difference was enlarged, suggesting that water diffused from the hotter to the colder side. It should be noted that the colder side of the sample was in contact with the FTIR apparatus at room temperature to avoid water condensation, and a temperature lower than room temperature was not applied due to the risk of changes in the water content.

Figure 12:
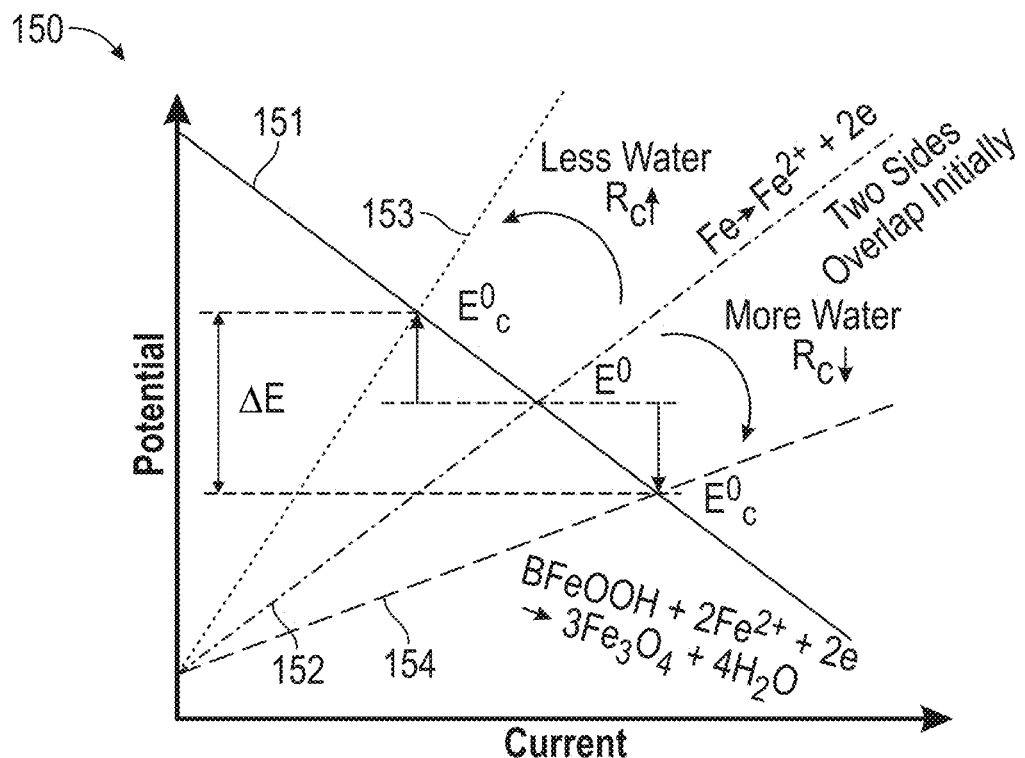
FIG. 12 is a graph illustrating an exemplary Evans diagram.

Referring to FIG. 12, an Evans diagram 150 illustrates how voltage was developed in an experimental hydro-electrochemical power generator. Particularly, the Evans diagram illustrates a cathodic-reduction reaction curve 151, an anodic oxidation reaction curve 152 under uniform temperature that shifts into an elevated water curve 153, and a reduced water curve 154 with more or less water, respectively, on the electrodes of the experimental power generator. Initially, the corrosion potential is located at the intersection between curves 151, 152. However, under a temperature gradient, the thermodiffusion of water reduces the amount of water in the hotter side, while that in the colder side increases. Water is an electrolyte in corrosion reactions, so a reduction in water renders the corrosion overpotential higher.

Not intending to be bound by any particular theory, the Tafel curve for oxidation shifts counterclockwise to the elevated water curve 153, and a new potential (crossover point) is established in accordance with the relation expressed below in Equation (1), where $E_i^0$ represents the potential of corrosion reaction, $E_{anode}$ represents the potential of anodic reaction, $I_iR_i$ represents the overpotential, $I_i$ represents the corrosion current, and $R_i$ represents the resistance of the electrolyte, and where the index I is either the hotter (h) or the colder side (c):

$$E_i^0 = E_{anode} + I_i R_i \quad (1)$$

On the other hand, higher water uptake decreases the overpotential, lowering the crossover point to the reduced water curve 154. Not intending to be bound by any particular theory, the newly established two crossover points between the reduction line and the raised/lowered oxidation lines for the hotter/colder sides create a potential difference between the two electrodes in accordance with the relation expressed below in Equation (2), where the index h represents the hotter side while the index c represents the colder side:

$$\Delta E = E_h^0 - E_c^0 = I_h R_h + I_c R_c \quad (2)$$

The potential difference is a function of the corrosion current and resistance, which are strongly affected by the amount of water in the electrodes.

Hydro-electrochemical power generators like the power generator 10 shown in FIGS. 1-6 are promising for various applications, including sensors and energy harvesters. For example, the colossal TtoE factor from these hydro-electrochemical power generators, which is several orders of magnitude larger than those of thermocouples, could give a substantial voltage response to a temperature difference and thereby ameliorate the signal-to-noise ratio. It is worth mentioning that in an experiment the corrosion of the carbon steel of the electrodes resulted in only approximately 18 micrometer (μm) reduction for six months.

Additionally, hydro-electrochemical power generators may function as an energy harvester even with the intermediate oxidation layer. For example and referring to FIG. 13, a graph 160 is shown illustrating voltage 161 produced by an experimental hydro-electrochemical power generator 162 connected in parallel with a 470 microfarad (μF) capacitor 163 and a 10 kΩ resistor 164 in parallel with switches S1, S2, and S3. Under a temperature difference of 8 K, the open-circuit voltage 161 reached 360 mV with "on" state only for S1 switch. Then, the capacitor 163 was charged to 350 mV by closing S2, and subsequently the capacitor 163 was discharged by a load resistor (S2 and S3 were closed). After repeated charge/discharge cycles, voltage 161 approached zero when the temperature of the power generator 162 became uniform.

Figures 13, 14:
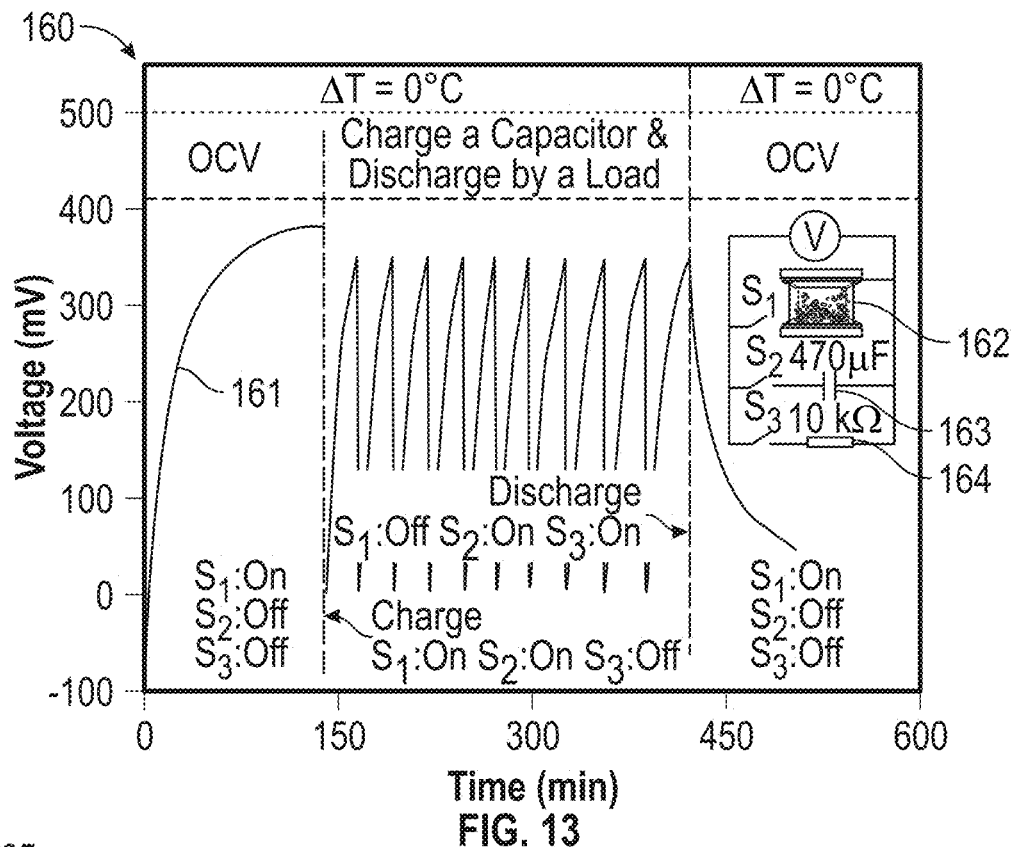
FIG. 13 is a graph illustrating voltage produced by an embodiment of a power generator in accordance with principles described herein.
FIG. 14 is a graph illustrating voltage produced by a plurality of power generators in accordance with principles described herein.

Referring to FIG. 14, a graph 165 is shown illustrating voltages 166, 167 produced by a plurality of hydro-electrochemical power generators connected in series at temperature gradients of 7.6° C. and 3.9° C., respectively. Additionally, FIG. 14 includes an inset graph 170 illustrating voltage profiles as a function of time as two, four, six, and eight hydro-electrochemical power generators were connected in series. In this example, under the temperature difference of 7.6° C. and 3.9° C., serially joined eight modules produced 2.8 V and 1.45 V, respectively. The linear relationship between voltage generation (e.g., voltages 166, 167) and the number of modules indicates that the output voltage can be elevated by serial connection.

Figure 15:
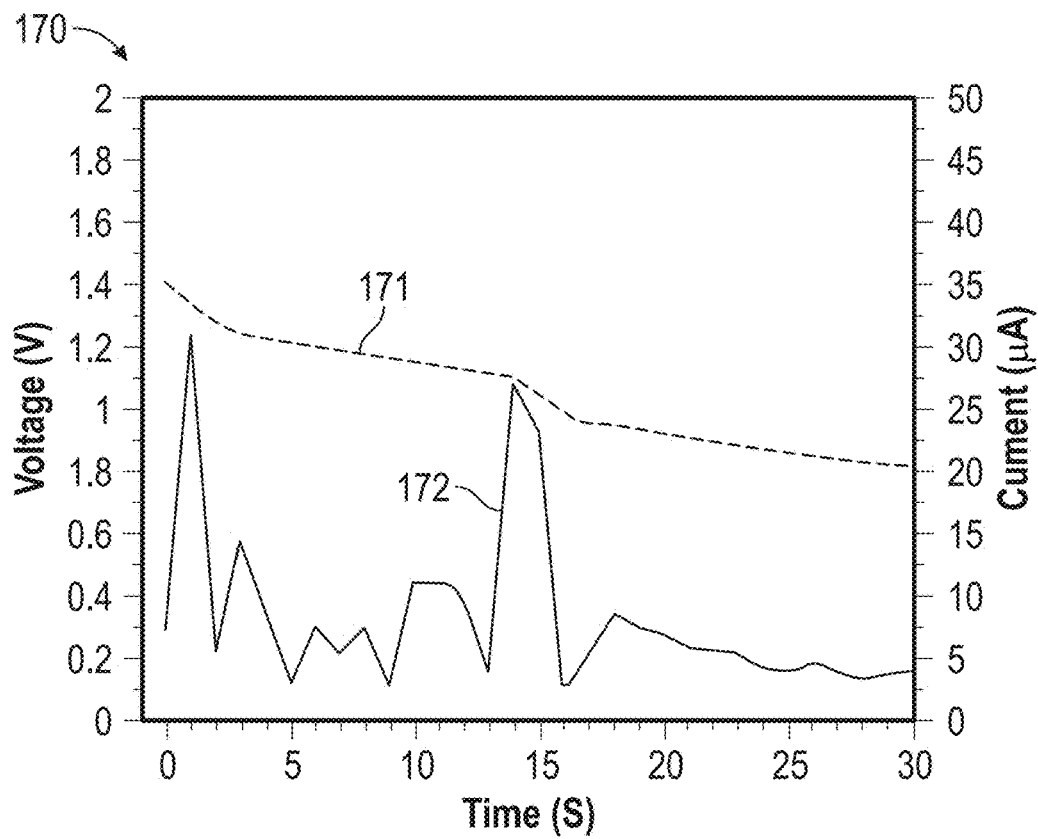
FIG. 15 is a graph illustrating voltage and current used to power an embodiment of a compact electronic device in accordance with principles described herein.

Referring to FIG. 15, a graph 170 is shown illustrating voltage 171 and current 172 which powered a compact electronic device in the form of a hygrometer equipped with a liquid crystal display (LCD). The voltage 171 and current 172 were produced by four serially coupled experimental hydro-electrochemical power generators with a 470 μF capacitor.

Figure 16:
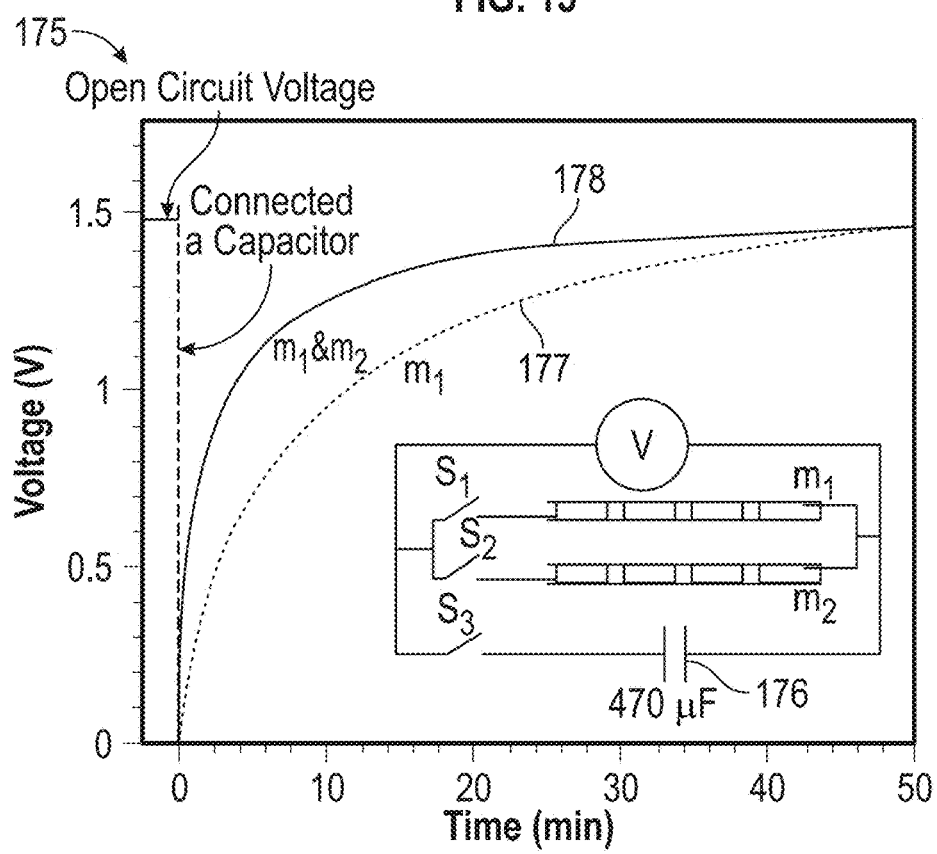
FIG. 16 is a graph illustrating voltage produced by a capacitor connected to a plurality of power generators in accordance with principles described herein.

Referring to FIG. 16, in another experiment a first module (m1) and a second module (m2) each comprising four serially connected hydro-electrochemical power generators were connected in parallel with a 470 μF capacitor 176 and in series with a plurality of switches S1, S2, and S3. A graph 175 of FIG. 16 illustrates a voltage 177 produced only by the first module m1 in parallel with capacitor 176 (switch S2 being open), and a second voltage 178 produced by the combined modules m1, m2 in parallel with capacitor 176 (each switch S1, S2, and S3 being closed. Initially, the open-circuit voltage 177, 178 was identical for both circuits, but the capacitor 176 was charged more rapidly with the circuit corresponding to voltage 178, showing approximately 2.5 minutes (min) for one time constant (63%), compared with approximately 9 min with the circuit corresponding to voltage 177. This elucidates that the hydro-electrochemical power generators described herein offer options for optimizing voltage and current for a system of interest.

Figure 17:
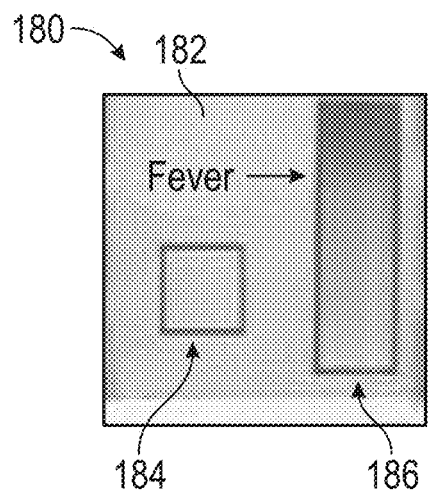
FIGS. 17-19 are side views of an embodiment of a compact electronic device at different stages of operation and in accordance with principles described herein.
Figure 18:
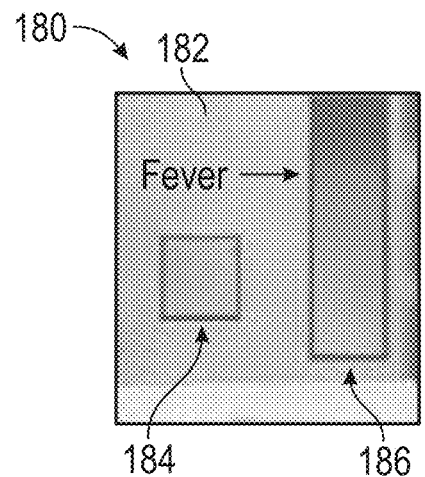
Figure 19:
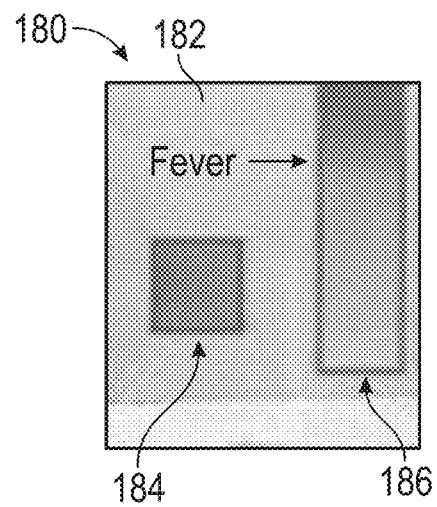

Referring now to FIGS. 17-19, an experimental self-sustainable fever detector 180 was developed utilizing the hydro-electrochemical power generators (e.g. power generator 10 shown in FIGS. 1-6) described herein. The fever detector 180 may be utilized for early detection and continuous monitoring of viral infectious diseases for humans and livestock. Fever detection based on conventional one-time measurement may suffer from false-negative results because it can be strongly affected by human errors, environmental conditions, and stage of infection, in addition to a risk of cross-infection. These drawbacks could be mitigated by continuous monitoring with low-cost and self-sustainable sensors and electrochromic display devices such as fever detector 180.

To visualize the temperature changes, an electrochromic display 182 of the fever detector 180 was electrically connected with four hydro-electrochemical power generators (not shown in FIGS. 17-19), each with a fully-developed oxidation layer. In this experiment, the electrochromic display 182 was made of Prussian white. When electricity was supplied to the display 182 by the hydro-electrochemical power generators, the color of a current status window 184 of the display 182 was changed from white to blue, and then, without electricity, from blue to white, reversibly. The color of the status window 184 may be compared by a user of the fever detector 180 with a fixed reference bar 186 of the display 182.

To mimic a situation with a fever, the heat flux from a human without and with a fever was assumed to be 360 watts per square meter (Wm$^{-2}$) and 580 Wm$^{-2}$, respectively, which have yielded the temperature differences (ΔT) of 1.8° C. (shown in FIG. 18) and 2.9° C. (shown in FIG. 19), respectively, across the device 180. Under the temperature differences, voltages of approximately 0.6 V and approximately 1 V were observed. Before the operation of the device 180, the status window 184 is white, as shown in FIG. 17. As shown in FIG. 18, when ΔT was 1.8° C., the color of the status window 184 was changed slightly to light blue, indicating the temperature is below a fever on the reference bar 186. As shown in FIG. 19, a further increase in ΔT to 2.9° C. resulted in a dark blue status window 184, indicating fever or higher temperature. For other or more sophisticated applications, the number of devices 180 can be readily altered, and the color of the reference bar 186 can be adjusted for desired temperature ranges.

As further detailed above, a method of generating a large TtoE factor, −87 mV K-1 at 22° C. and 50% RH (in some embodiments) has been disclosed through utilizing the change in the corrosion potential due to the thermodiffusion of water. The developed thermo-hydro-electrochemical conversion concept has been further developed herein by powering electronic devices, including the fever detector 180 that can be distributed to many unspecified people at public places at a low price. It is anticipated that the hydro-electrochemical power generators described herein may achieve even greater TtoE factors which may be utilized in the development of self-sustainable electronic devices, including, for example, disposable, low-cost, and compact sensors.

Figure 20:
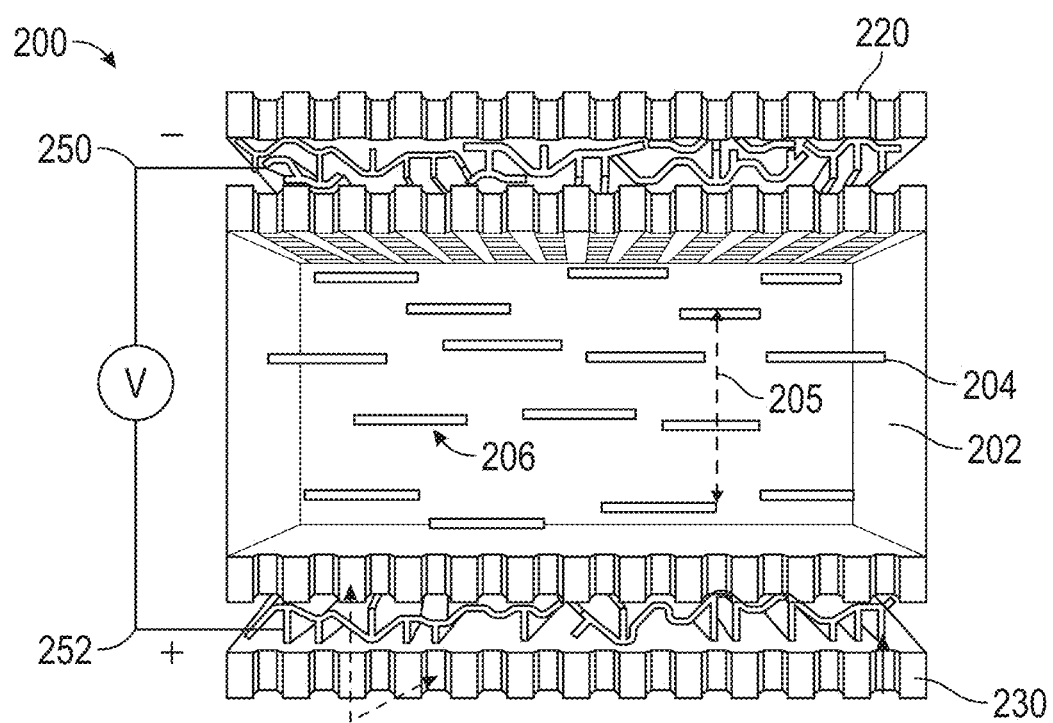
FIG. 20 is a schematic side view of another embodiment of a hydro-electrochemical power generator in accordance with principles described herein.

Some embodiments of hydro-electrochemical power generators need not rely on the generation of a temperature gradient to trigger an electrical power producing corrosion rate gradient between the pair of electrodes of the power generator. Referring now to FIG. 20, another embodiment of a hydro-electrochemical power generator 200 is shown that does not rely on the creation of a temperature gradient for activation. In this exemplary embodiment, the power generator 200 generally includes an interlayer or solid-state electrolyte 202, a first or top electrode 220, a second or bottom electrode 240 spaced vertically below the top electrode 220. Power generator 200 additionally includes a pair of electrical connectors or terminals 250, 252 electrically connected to the electrodes 220, 240, respectively.

The electrolyte 202 of power generator 200 is positioned between the pair of electrodes 220, 240 and comprises a hygroscopic material. In this exemplary embodiment, electrolyte 202 comprises polystyrene sulfonic acid (PSS—H) 204 and chemically expanded graphite CEG particles 206 (only one of which is labeled in FIG. 20). The CEG particles 206 are aligned with each other and embedded within the PSS—H 204 perpendicular to a water transport direction (indicated by double arrow 205 in FIG. 20) of the power generator 200. Water transport direction 205 coincides with a vertical, longitudinal axis extending through opposing ends of the electrolyte 202. CEG particles 206 act to interrupt or impede the diffusion of water molecules within electrolyte 202 along the water transport direction 205. In other embodiments, electrolyte 202 may be formed from other hygroscopic materials such as, for example cellulose, metal-organic framework (MOF), sodium polyacrylate, and/or various salt hydrates (e.g., $Zn(NO_3)_2-6H_2O$).

In some embodiments, electrolyte 202 may be formed by drop-casting an aqueous mixture solution containing PSS—H 204 and CEG particles 206 in a container. During the water evaporation process without disturbance, CEG particles 206 are aligned in the direction parallel to the electrode due to gravity. Also, during the water evaporation process, cracks form in the PSS—H, which indicates the formation of water passages perpendicular to the plane of CEG particles 206. This in-turn indicates that water transport along the water transport direction 206 is effectively impeded by the aligned CEG particles 206. For example, in an experiment where a water droplet was applied to the top electrode 220 of an experimental power generator 200, the difference between the water uptakes of the first and bottom electrodes 220, 240, respectively, was maintained for a longer period of time, which has extended the electricity generation.

In this exemplary embodiment, each electrode 220, 240 of power generator 200 is porous allowing for the transport of water therethrough and includes a pair of carbon steel mesh layers 222, 242, respectively, and a carbon steel wool layer 224, 244, respectively, which is sandwiched between the pair of carbon steel mesh layers 222, 242. The sandwiched structure of electrodes 220, 240 with fine wires from the wool layers 224, 244 increases the surface contact area with water molecules from the electrolyte 202. To improve the electrical connection between the mesh layers 222, 242 and wool layers 224, 244, the sandwiched structure of electrodes 220, 240 is compressed during the formation of electrodes 220, 240 causing the larger diameter wires of the mesh layers 222, 242 to become interwoven in a checker pattern with the smaller diameter wires of the wool layers 224, 244, ensuring many electrical connections between mesh layers 222, 242 and the corresponding wool layers 224, 244.

Electrodes 220, 240 are formed from and comprise the same material, preventing the power generator 200 from activating when water molecules are uniformly distributed within the electrolyte 202 and thereby maximizing the operational life of power generator 200. While in this exemplary embodiment electrodes 220, 240 comprise carbon steel, in other embodiments, electrodes 220, 240 may comprise other corrodible metallic materials such as, for example all metals excluding noble metals (e.g., gold platinum, etc.) which are not subject to corrosion. In some embodiments, to facilitate the hydro-electrochemical energy generation from the carbon steel of electrodes 220, 240, the electrodes 220, 240 are corroded with a hydrochloric acid solution prior to integrating the electrodes 220, 240 with electrolyte 202.

Figure 21:
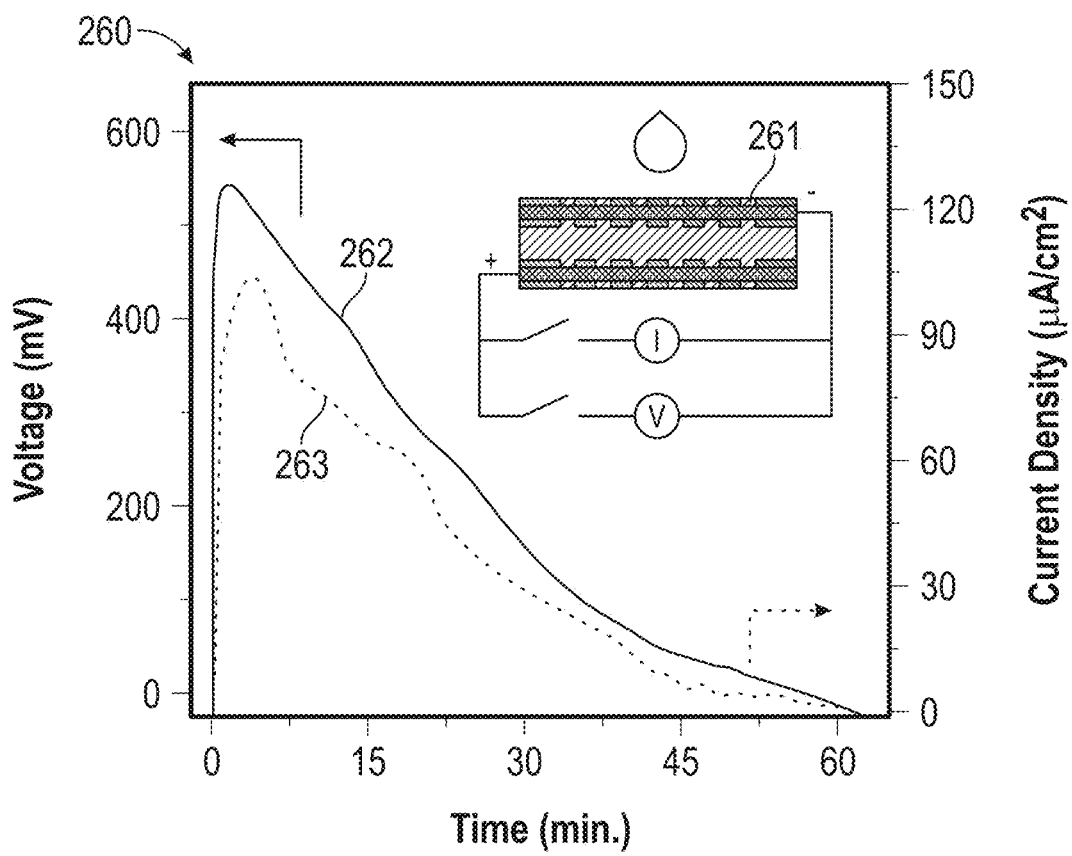
FIG. 21 is a graph illustrating voltage and current produced by an embodiment of a power generator in accordance with principles described herein.
Figure 22:
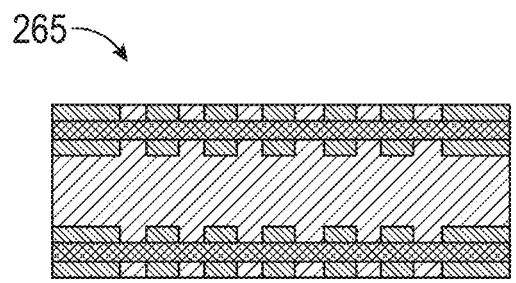
FIGS. 22-25 are schematic views of different embodiments of hydro-electrochemical power generators in accordance with principles described herein.
Figure 23:
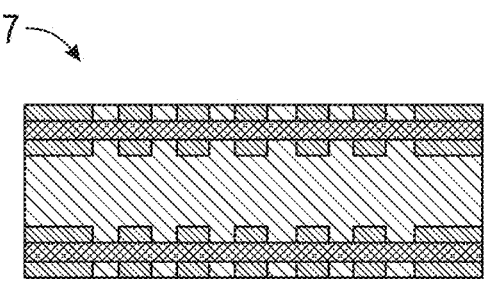
Figure 24:
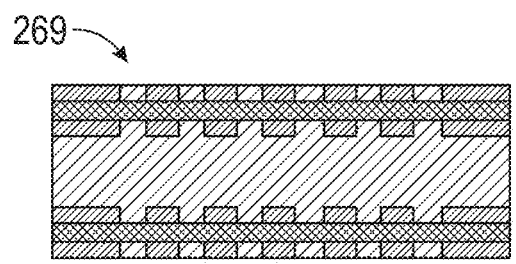
Figure 25:
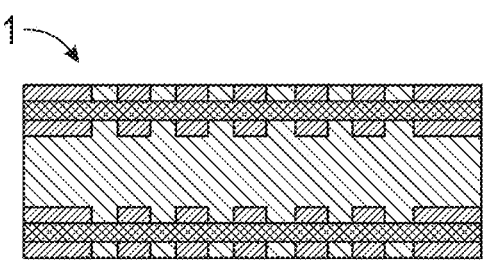

Referring to FIG. 21, in an experiment, an experimental power generator 261 similar in configuration to power generator 200 and including two corroded steel electrodes and a CEG-embedded PSSH electrolyte was tested as a function of time, as shown in graph 260 of FIG. 21. Particularly, both the open-circuit voltage 262 and short-circuit current 263 provided by the unit 261 were tested when 200 microliters (μl) water was dropped on the top side (1.5×1.5 cm2) of the top electrode of the unit 261. On the corroded electrode of power generator 261, $\beta$-FeOOH/Fe2+ redox couple was present, and electrons were drawn and donated between the two corroded electrodes, showing the short-circuit current 263 upon creating the potential difference. When the water reached the electrolyte of the power generator 261, the water transport was driven by slow diffusion due to the concentration difference and gravity.

An advantage of the power generator 261 (and that of unit 200 described above) is that the unit 261 activates upon the application of a drop of water without necessitating special external stimuli or energy input. For instance, conventional ion-gradient based electric power generation requires spontaneous and continuous changes in relative humidity (over 70%) to generate a sufficient voltage. In this experiment, the maximum open-circuit voltage 262 (approximately 540 mV) and the maximum short-circuit current 263 (approximately 105 microamps per centimeter squared ($\mu A\ cm^{-2}$)) were observed at about four minutes, and both voltage 262 and current 263 were gradually decreased over 65 minutes. The reductions in voltage 262 and current 263 may be attributed to the water diffusion from the top to the bottom of the power generator 261 due to the gravity and concentration difference. Eventually, the electrochemical potentials of both electrodes of the power generator 261 became identical, resulting in zero voltage 262 and current 263 when the water becomes uniformly distributed through the electrolyte of the power generator 261.

Referring to FIGS. 22-25, in additional experiments, four different experimental power generators 265, 267, 269, and 271 were developed similar in many respects as power generator 200 but each having a uniquely configured electrolyte and pair of electrodes. Particularly, power generator 265 of FIG. 22 has an electrolyte similar in configuration as electrolyte 202 of power generator 200, and thus is comprised of a CEG-embedded PSS—H electrolyte and two identical corroded carbon steel electrodes. Power generator 267 of FIG. 23 includes an electrolyte comprised of pure PSS—H with corroded steel electrodes. Power generator 269 of FIG. 24 includes non-corroded steel electrodes. Finally, power generator 271 of FIG. 25 includes an electrolyte comprised of pure PSS—H with non-corroded steel electrodes.

Figure 27:
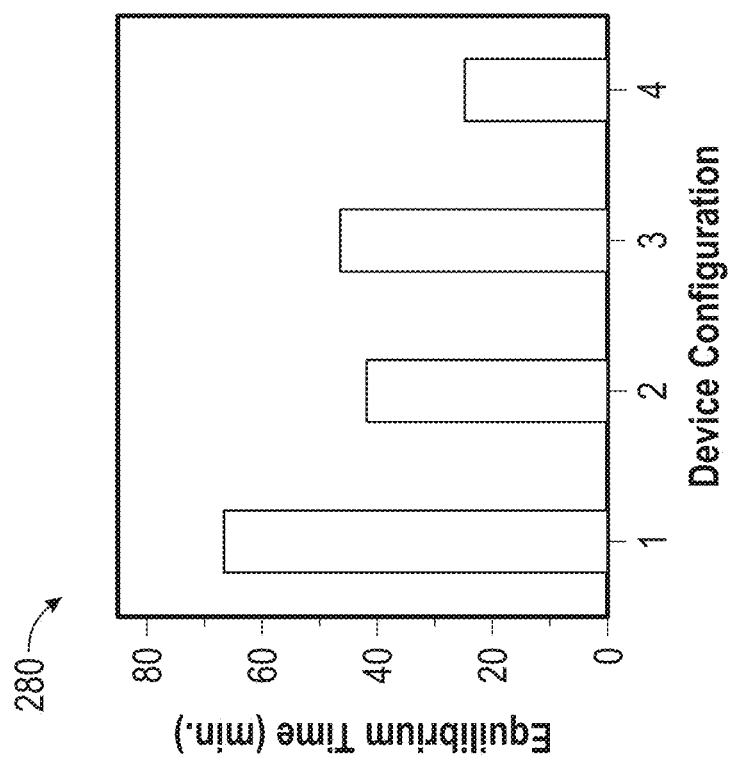
FIG. 27 is a graph illustrating an equilibrium time for the power generators of FIGS. 22-25.
Figure 26:
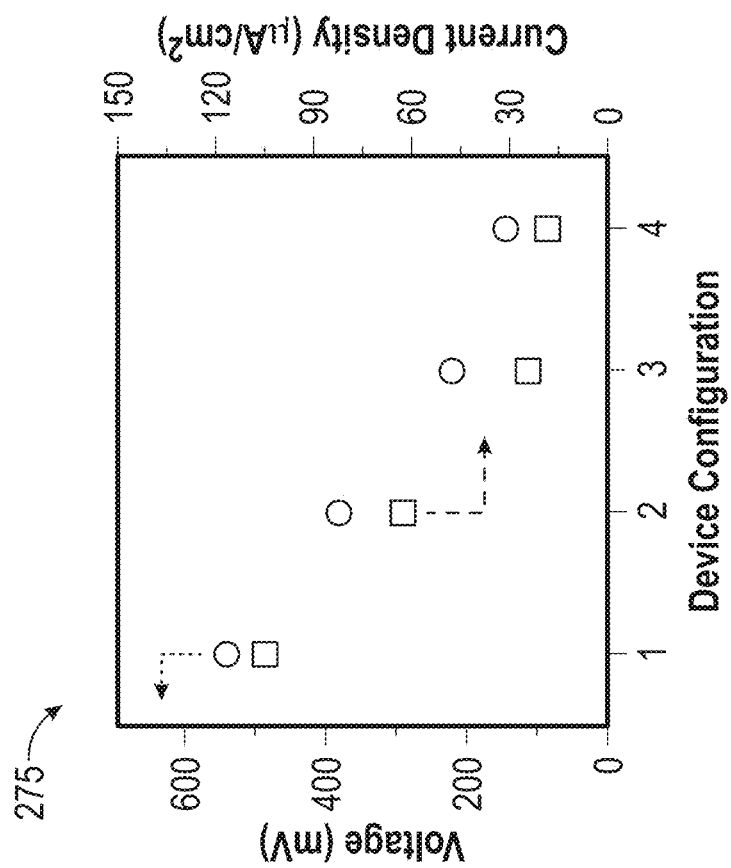
FIG. 26 is a graph illustrating a maximum voltage produced by the power generators of FIGS. 22-25.

Referring to FIGS. 26, 27, FIG. 26 includes a graph 275 is shown indicating the maximum open-circuit voltage (the circles of graph 275) and maximum open-circuit current (the squares of graph 275) produced by each of the power generators 265, 267, 269, and 271 in an experiment. For convenience, power generator 265 is listed as device configuration 1 in graph 275, unit 267 is listed as device configuration 2, unit 269 is listed as device configuration 3, and unit 271 is listed as device configuration 4.

FIG. 27 includes a graph 280 illustrating an equilibrium time for each of the device configurations where "equilibrium time" refers to the time period for the voltage of each device configuration to return to its initial zero value as an equilibrium in the water diffusion is reached in the electrolyte of the device configuration. The equilibrium time is related to the duration of device operation after an initial event such as applying a water droplet. As indicated by graphs 275, 280, power generator 265 displayed the greatest voltage, current, and equilibrium time. Additionally, the corroded electrodes of power generators 265, 267 provided greater voltage and current compared with those of non-corroded electrodes (power generators 269, 271). Further, power generators 265, 269, which included the CEG embedded electrolyte, provided extended the equilibrium time, extending the device operation time, indicating the water diffusion was impeded in power generators 265, 269 relative to power generators 267, 271 which did not include a CEG embedded electrolyte.

Figure 29:
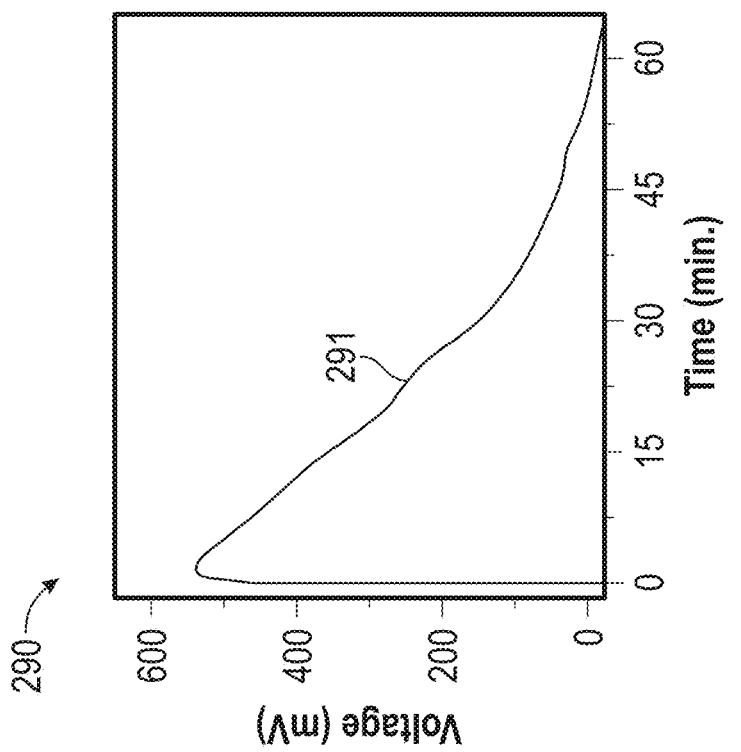
FIGS. 28 and 29 are graphs illustrating voltages produced by different embodiments of hydro-electrochemical power generators in accordance with principles described herein.
Figure 28:
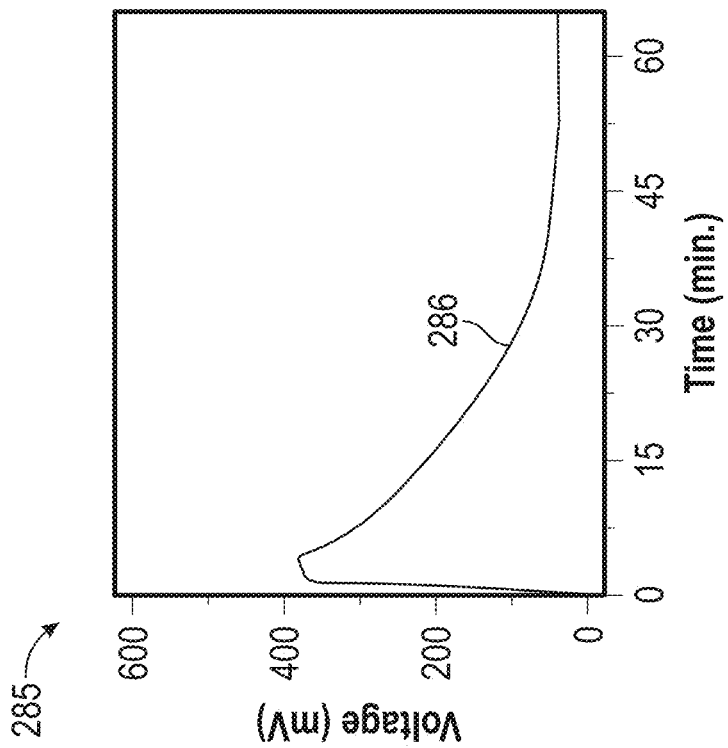

Experiments were also conducted to determine the relative voltage outputs for power generators having a CEG embedded electrolyte versus a pure PSS—H electrolyte. Particularly and referring to FIGS. 28, 29, graphs 285, 290 are shown, respectively, which illustrate voltage 286 (graph 285) provided by a power generator comprising a pure PSS—H electrolyte and a voltage 291 (graph 290) provided by a power generator comprising a CEG-embedded PSS—H electrolyte. In this manner, graphs 285, 290 illustrate the difference in the water diffusion with and without CEG embedded in the PSS—H electrolyte.

Specifically, when water was applied to the top side of each power generator, the water diffused relatively quickly in the PSS—H electrolyte associated with graph 285 toward the bottom due to gravity. Conversely, water transport through the CEG-embedded PSS—H electrolyte of the power generator associated with graph 290 was effectively impeded by the embedded CEG, causing it to take longer for the water to reach the bottom electrode of the power generator. In this experiment, the pure PSS—H power generator associated with graph 285 device generated a maximum open-circuit voltage of ~400 mV with an equilibrium time of 45 minutes, whereas the embedded CEG power generator associated with graph 291 had a greater maximum open-circuit voltage to 540 mV and an elongated equilibrium time over sixty minutes.

Initially, before applying water to the top electrode of the two power generators, the electrochemical potentials of the two electrodes for each power generator were identical. When water soaked into the top electrode of each power generator, the electrode potential of the top electrode decreased as a result of a smaller overpotential, consistent with the findings of the Evans diagram 150 shown in FIG. 12. The newly established oxidation line created a potential difference (i.e., non-zero output voltage) between the top and bottom electrodes of each power generator. At this stage, voltage 286, 291 rose rapidly during the time period from 0 to approximately five minutes for each power generator because of the porosity of the top electrode of each unit. As the water diffused all the way through the interlayer to the bottom electrode, the electrode potentials of the two electrodes were closer, showing gradually decaying voltage 286, 291. Therefore, the time duration of voltage generation depends substantially on the time period for water to reach the bottom electrode and thus the resistance to water transport through the electrolyte of the particular power generator.

Figure 30:
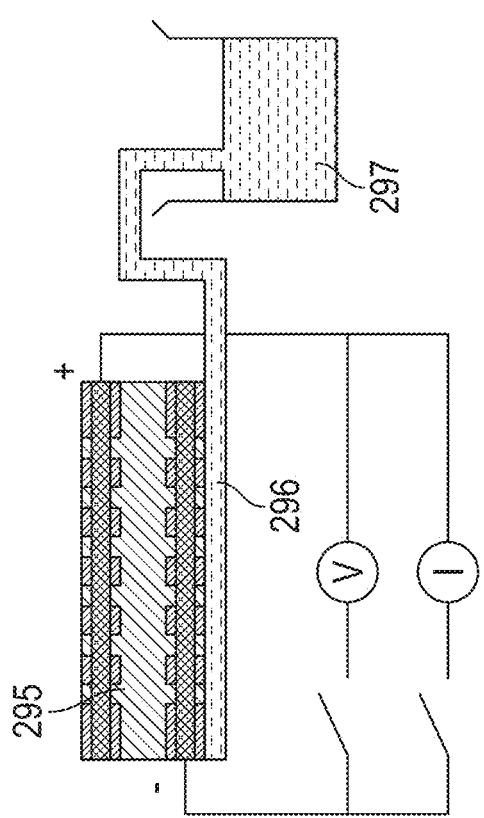
FIG. 30 is a schematic view of another embodiment of a hydro-electrochemical power generator in accordance with principles described herein.

To have a more prolonged operation of the device, dissimilar electrochemical potentials between the two electrodes should be maintained for a longer time period. Referring to FIG. 30, in another experiment, the direction of water diffusion was reversed through a power generator 295 comprising a CEG embedded electrolyte by continuously supplying water into the bottom electrode of the power 295 unit through a wet tissue 296 in fluid contact with a water reservoir 297. While water diffused from the bottom to the top of the power generator 295 due to the concentration difference in the electrolyte of the power generator 295, gravity urged the water downward, thereby impeding or delaying the upwards water transport through the power generator 295 and elongating the time period for the water to diffuse all the way to the top electrode of the unit 295.

Figure 31:
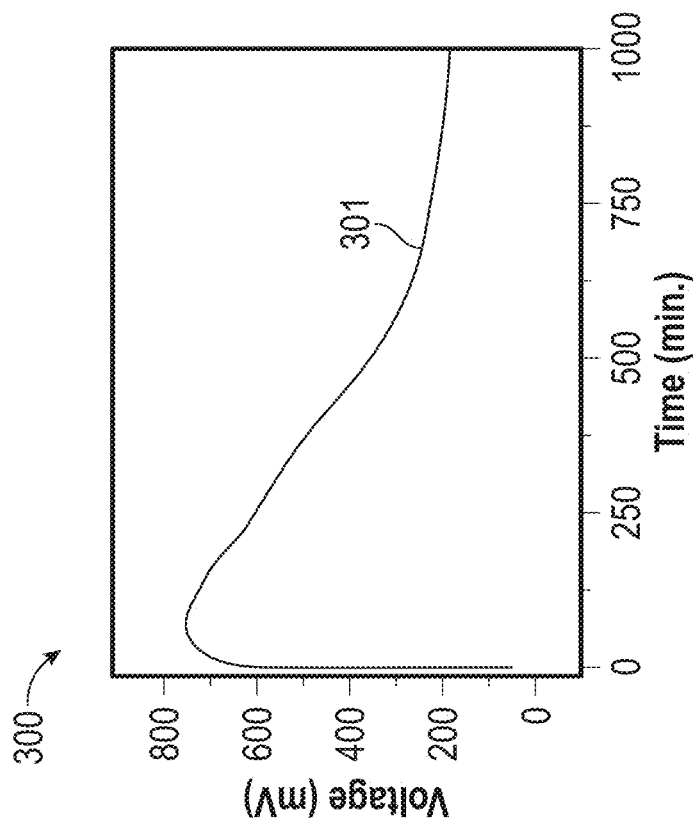
FIG. 31 is a graph illustrating a voltage produced by the power generator of FIG. 30.
Figure 32:
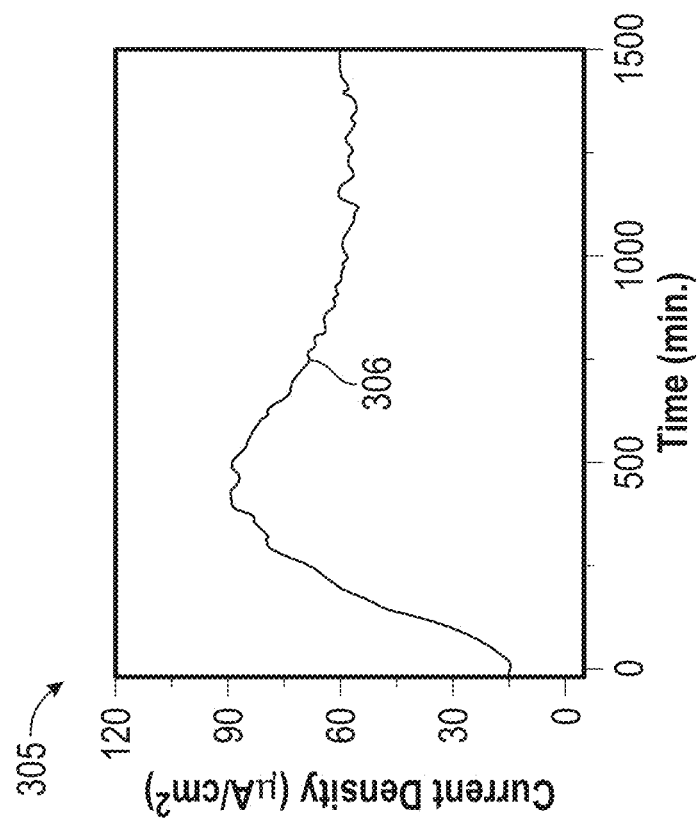
FIG. 32 is a graph illustrating a current produced by the power generator of FIG. 30.

Referring to FIGS. 31, 32, an open-circuit voltage 301 of the power generator 295 is shown in a graph 301 of FIG. 31 while an open-circuit 306 of the unit 295 is shown in a graph 305 of FIG. 32. According to the open-circuit voltage 301, the maximum voltage produced by power generator 295 was approximately 750 mV, a greater value than that produced in the previously discussed experiment in which the water transport and gravity directions are coincident. The increased voltage 301 was observed for a substantially long period of time—approximately 60 minutes in this experiment. Additionally, the non-zero voltage of power generator 295 was maintained much longer, over 1000 minutes, compared to the voltages 286, 291 shown in graphs 285, 290 discussed above.

Further, the maximum open-circuit current 306 was similar regardless of the water diffusion direction, but the non-zero current 306 was observed for a substantially greater period of time, and maintained to approximately 60 $\mu A\ cm^{-2}$ even after approximately 1500 minutes of operation. Such a long operation time is advantageous compared to conventional energy harvesters. For example, conventional triboelectric devices utilizing water droplets can generate several $\mu A$ for only short periods of time on the order of milliseconds in a form of alternating current that requires additional electronic components such as rectifiers and capacitors. Moreover, it is necessary in such conventional devices to change the position of water droplets continuously to generate electricity. As another example, conventional devices utilizing streaming current can generate voltage for several hours to a day, but the generated current is very small in the range between a few hundred nanoamps (nA) and a few $\mu A$, which make it difficult to continuously generate desirable power of microwatts ($\mu W$) for operating electronics in practice.

Figure 33:
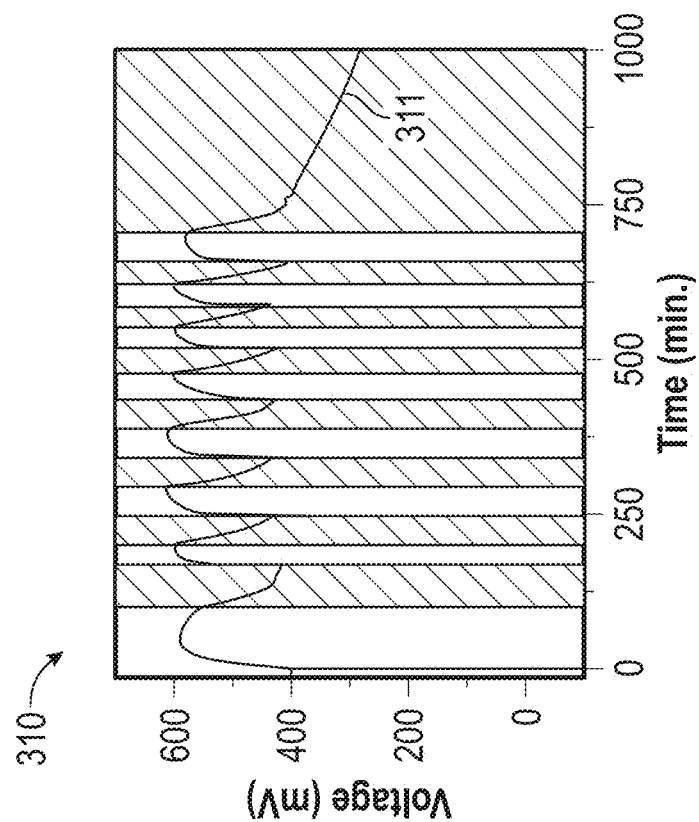
FIG. 33 is another graph illustrating a voltage produced by the power generator of FIG. 30.

In another experiment, water was supplied interruptedly to the bottom electrode of power generator 295. Referring to FIG. 33, an open-circuit voltage 311 is illustrated in a graph 310 of FIG. 33. The shaded areas of graph 310 illustrate the time periods in which power generator 295 was disconnected from the water reservoir 297 while the unshaded regions of graph 310 illustrate the time periods in which unit 295 was connected to and in fluid communication with water reservoir 297. Upon disconnecting the water supply, the voltage 311 dropped but was recovered when water was resupplied. When water was not supplied, water diffused into the electrolyte of power generator 295 towards the top electrode thereof, lessening the water concentration difference between the top and bottom electrodes and bringing the corrosion potentials of the two electrodes closer together (i.e., producing a lower output voltage).

Figure 34:
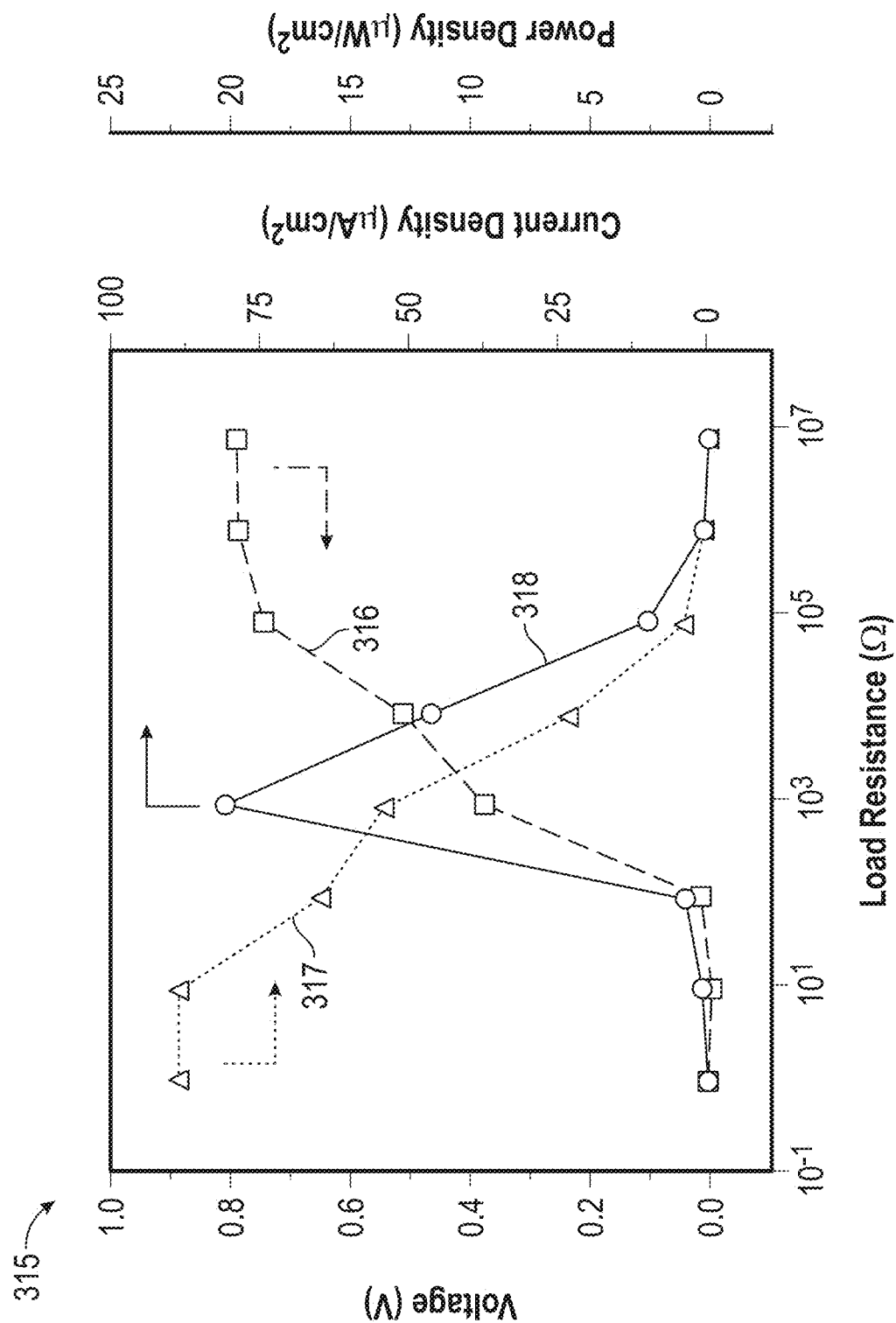
FIG. 34 is a graph illustrating voltage, current, and power density as a function of load resistance of the power generator of FIG. 30.

Referring to FIG. 34, a graph 315 is shown which illustrates voltage 316, current 317, and power density 318 measured from the power generator 295 as a function of load resistance. With increasing load resistance, the output voltage 316 increased gradually, whereas the output current 317 was diminished. The output power 318 was obtained by multiplying the voltage and current, yielding, in this experiment a maximum power of approximately 20 microwatts per centimeter squared ($\mu W\ cm^{-2}$) with a load resistance of approximately 103 ohms ($\Omega$).

Figure 36:
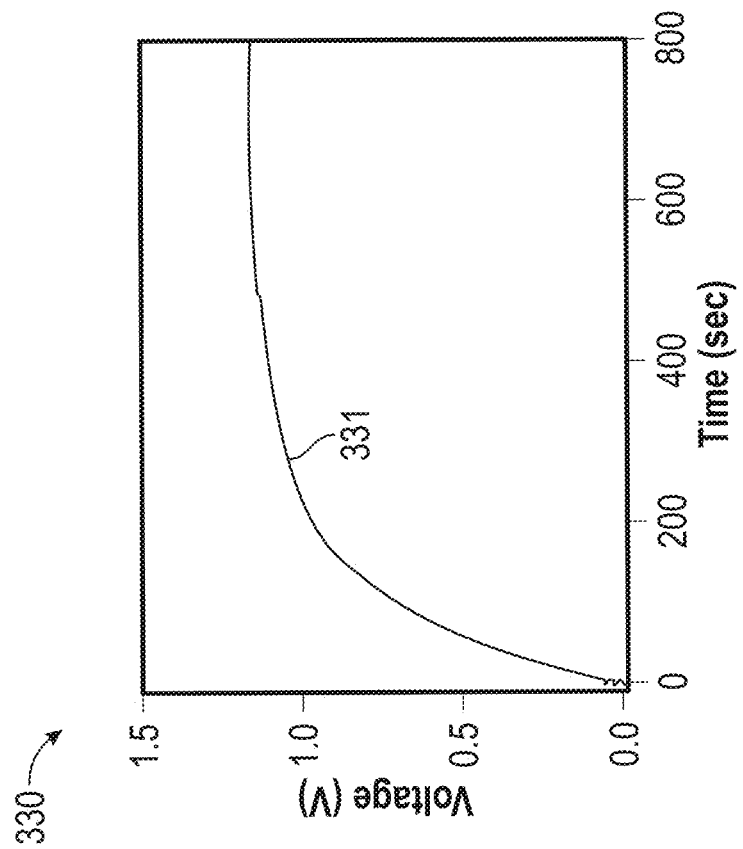
FIG. 36 is a graph illustrating voltage produced by a power generator of the compact electronic device of FIG. 35.
Figure 35:
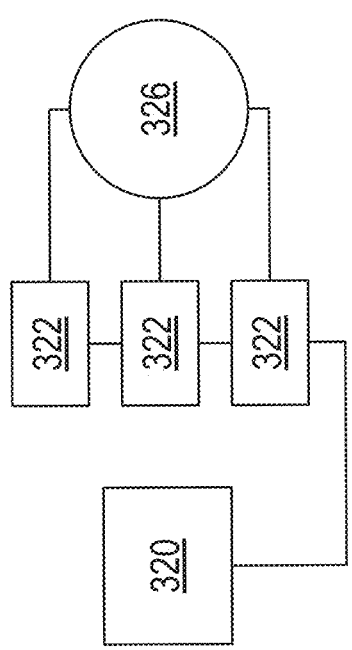
FIG. 35 is a schematic view of another embodiment of a compact electronic device in accordance with principles described herein.

Further experiments were conducted to demonstrate the feasibility of operating compact electronic devices using power generators similar in configuration to power generator 200 shown in FIG. 20. Referring to FIG. 35, a compact electronic device 320 is shown in the form of an electrochromic display 320 connected in series with three power generators 322 similar in configuration to the power generator 200 described above. The electrochromic display 320 changes color when charges are supplied because the redox states of the electrodes of power generators 322 are altered. In this experiment, water was supplied from a water reservoir 326 to the bottom electrode of each of the power generators 322. Referring to FIG. 36, output voltage 331 of the power generators 322 of FIG. 35 is shown in a graph 330 of FIG. 36. In this experiment, when voltage 331 reached approximately 1.15 V after 800 seconds (s), the pixel color of the electrochromic display 320 was altered, indicating a different pattern in the display 320.

Figure 38:
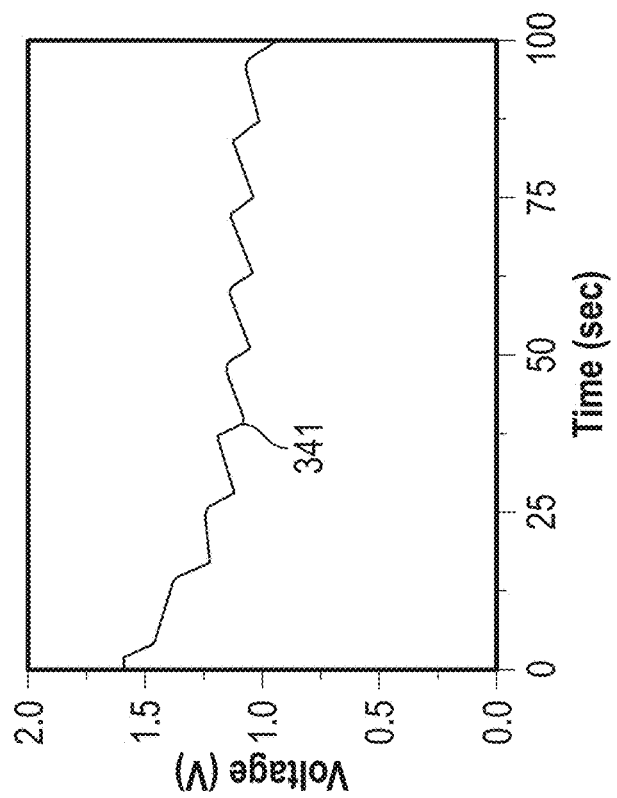
FIG. 38 is a graph illustrating voltage applied to a compact electronic device by the capacitor of FIG. 37.
Figure 37:
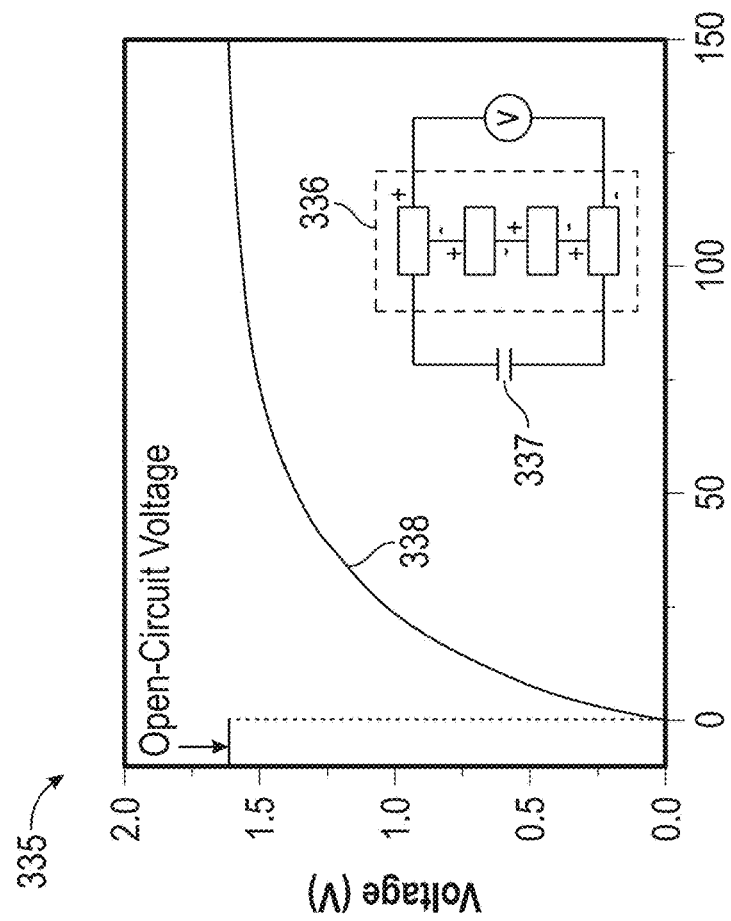
FIG. 37 is a graph illustrating voltage produced by a capacitor charged by an embodiment of a hydro-electrochemical power generator in accordance with principles described herein.

Referring to FIGS. 37, 38, in a separate experiment four power generators 336 similar in configuration to power generator 200 were connected with a 470 µF capacitor 337 as shown in a graph 335 of FIG. 37. Graph 335 also indicates an output voltage 338 of the capacitor 337 (stored from the power generators 336) over time. In this experiment, after 150 seconds, the capacitor 337 was charged to approximately 1.5 V, permitting the capacitor 337 to power a compact electronic device in the form of a hygrometer. A graph 340 of FIG. 38 illustrates an output voltage 341 of the capacitor 337 over time as the capacitor 337 powered the hygrometer. In this experiment, the hygrometer successfully operated for approximately 100 seconds as the output voltage 341 of the capacitor 337 decayed to a minimum voltage of 1 V of the hygrometer.

While embodiments of the disclosure have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A hydro-electrochemical power generator, comprising:
    an interlayer having a first end and a second end opposite the first end, and comprising a solid-state electrolyte comprising a water bearing hygroscopic material;
    a first electrode in contact with the first end of the interlayer, wherein the first electrode comprises a first material that is a corrodible metallic material;
    a second electrode in contact with the second end of the interlayer, wherein the second electrode comprises a second material that is a corrodible metallic material, and wherein an interfacial surface of at least one of the first and second electrodes in contact with the solid-state electrolyte comprises an oxidation layer containing $\beta$-FeOOH; and
    at least one heat source coupled to one of the first electrode and the second electrode and configured to apply a temperature gradient across the first end and the second end of the interlayer, and wherein the first electrode and the second electrode are configured to output a non-zero electrical voltage in response to the application of the temperature gradient.

2. The hydro-electrochemical power generator of claim 1, wherein the first material and the second material are the same material.

3. The hydro-electrochemical power generator of claim 1, wherein the first material and the second material are the same carbon steel material.

4. The hydro-electrochemical power generator of claim 1, wherein the hygroscopic material comprises polyaniline and polystyrene sulfonate (PANI:PSS).

5. A hydro-electrochemical power generator, comprising:
    a solid-state electrolyte having a first end and a second end opposite the first end, wherein the solid-state electrolyte comprises a water bearing hygroscopic material;
    a first electrode in contact with the first end of the solid-state electrolyte;
    a second electrode in contact with the second end of the solid-state electrolyte, and wherein an interfacial surface of at least one of the first and second electrodes in contact with the solid-state electrolyte comprises an oxidation layer containing $\beta$-FeOOH; and
    at least one heat source coupled to one of the first electrode and the second electrode and configured to apply a temperature gradient across the first end and the second end of the solid-state electrolyte, and wherein the first electrode and the second electrode are configured to output a non-zero electrical voltage in response to the application of the temperature gradient.

6. The hydro-electrochemical power generator of claim 5, wherein the hygroscopic material comprises polyaniline and polystyrene sulfonate (PANI:PSS).

7. The hydro-electrochemical power generator of claim 5, wherein the first electrode comprises a first material, the second electrode comprises a second material, and the first material is the same as the second material.

8. The hydro-electrochemical power generator of claim 5, wherein the first electrode comprises a first material, the second electrode comprises a second material, and the first material and the second material are each a corrodible metallic material.

9. The hydro-electrochemical power generator of claim 5, wherein the solid-state electrolyte has a water content greater than 10% by weight (wt %).

* * * * *